(12) United States Patent
Kato et al.

(10) Patent No.: US 12,493,240 B2
(45) Date of Patent: Dec. 9, 2025

(54) EXPOSURE APPARATUS, METHOD FOR MANUFACTURING DEVICE, METHOD FOR MANUFACTURING FLAT PANEL DISPLAY, AND EXPOSURE METHOD

(71) Applicant: NIKON CORPORATION, Tokyo (JP)

(72) Inventors: Masaki Kato, Yokohama (JP); Yasushi Mizuno, Saitama (JP); Hitoshi Mizuno, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 144 days.

(21) Appl. No.: 18/377,006

(22) Filed: Oct. 5, 2023

(65) Prior Publication Data
US 2024/0027898 A1     Jan. 25, 2024

Related U.S. Application Data

(63) Continuation of application No. PCT/JP2022/017099, filed on Apr. 5, 2022.

(30) Foreign Application Priority Data

Apr. 9, 2021    (JP) ................................ 2021-066819

(51) Int. Cl.
     *G03F 7/00*          (2006.01)

(52) U.S. Cl.
     CPC ........ *G03F 7/0007* (2013.01); *G03F 7/70191* (2013.01); *G03F 7/70516* (2013.01)

(58) Field of Classification Search
     CPC ............... G03F 7/0007; G03F 7/70191; G03F 7/70516; G03F 7/20; G03F 7/70291;
(Continued)

(56) References Cited

U.S. PATENT DOCUMENTS 5,610,683 A * 3/1997 Takahashi ........... G03F 7/70341
                                                 355/53
6,906,782 B2 * 6/2005 Nishi .................. G03F 7/70716
                                                 355/72
(Continued)

FOREIGN PATENT DOCUMENTS

JP     H08-313842 A    11/1996
JP     2005-286346 A    10/2005
(Continued)

OTHER PUBLICATIONS

May 24, 2022 International Search Report issued in International Patent Application No. PCT/JP2022/017099.
(Continued)

*Primary Examiner* — Hung V Nguyen
(74) *Attorney, Agent, or Firm* — Oliff PLC

(57) ABSTRACT

An exposure apparatus that scans and exposes a substrate via an optical modulator in which a plurality of elements are controlled according to an image pattern, the exposure apparatus includes a first stage that supports a first substrate, a second stage that supports a second substrate different from the first substrate, a measurement part that measures information about the second substrate, and a generation part that generates control data, which controls the plurality of elements during scanning and exposing the second substrate, based on the information during an exposure process of the first substrate, wherein the measurement part measures the information about the second substrate during the exposure process of the first substrate.

31 Claims, 9 Drawing Sheets

(58) Field of Classification Search
CPC ............... G03F 7/70508; G03F 9/7003; G03F
7/70358; G03F 7/70725; G03F 7/7085;
H01L 21/68
See application file for complete search history.

(56) References Cited

U.S. PATENT DOCUMENTS

| | | | | |
|---|---|---|---|---|
| 7,177,008 | B2* | 2/2007 | Nishi | G03F 7/70716 |
| | | | | 355/72 |
| 9,207,549 | B2* | 12/2015 | Shibazaki | G03F 9/7049 |
| 2008/0187871 | A1 | 8/2008 | Fukui et al. | |

FOREIGN PATENT DOCUMENTS

| | | |
|---|---|---|
| JP | 2007-108559 A | 4/2007 |
| JP | 2008-191303 A | 8/2008 |
| JP | 2016-178231 A | 10/2016 |

OTHER PUBLICATIONS

May 24, 2022 Written Opinion issued in International Patent Application No. PCT/JP2022/017099.
Mar. 12, 2024 Office Action issued in Japanese Patent Application No. 2023-513022.
Jun. 18, 2025 Office Action issued in Korean Patent Application No. 10-2023-7033912.

* cited by examiner

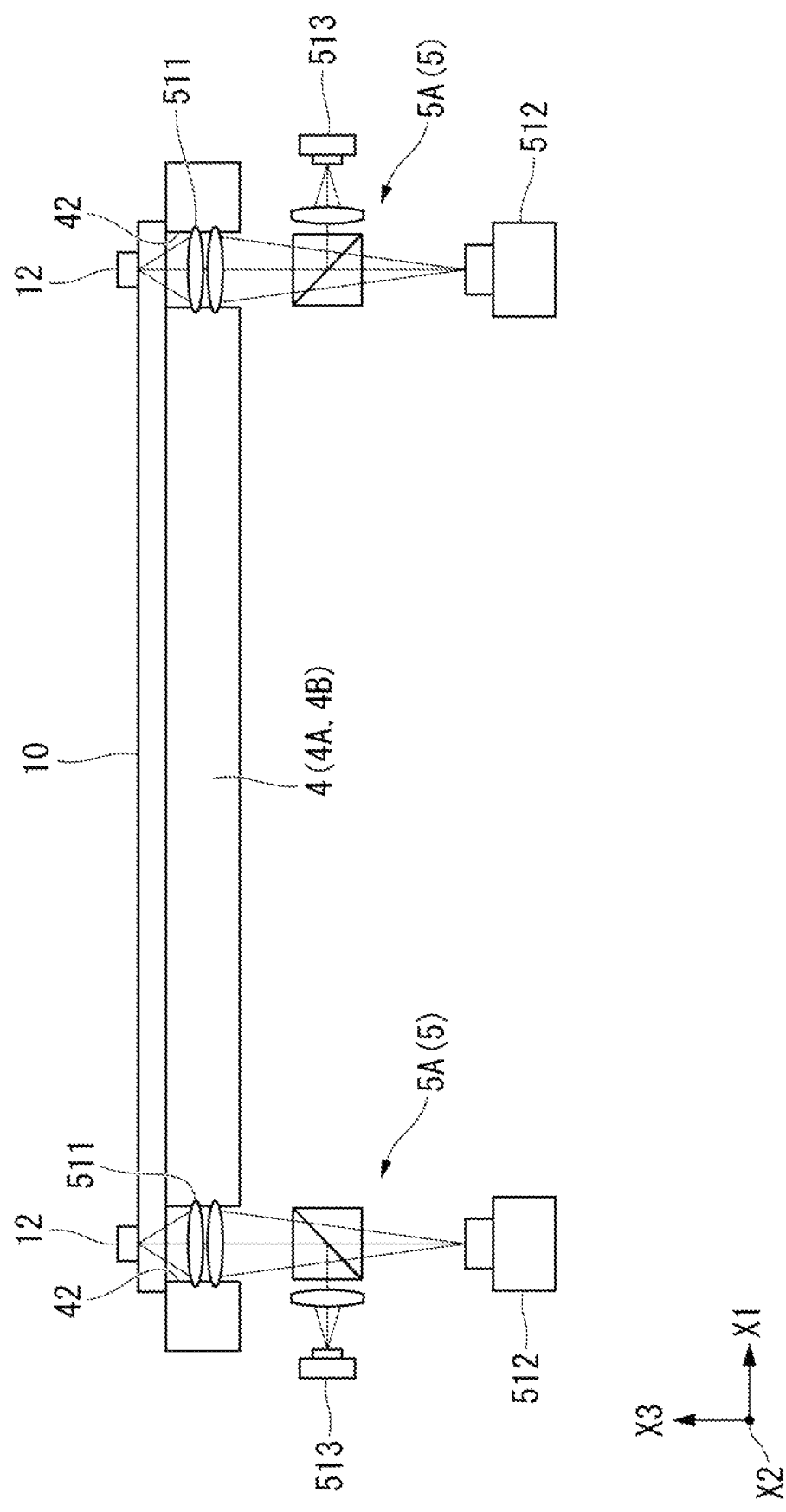

EXPOSURE APPARATUS, METHOD FOR MANUFACTURING DEVICE, METHOD FOR MANUFACTURING FLAT PANEL DISPLAY, AND EXPOSURE METHOD

CROSS-REFERENCE TO RELATED APPLICATION

Priority is claimed on Japanese Patent Application No. 2021-066819, filed on Apr. 9, 2021. The present application is a continuation application of International Application PCT/JP2022/017099, filed on Apr. 5, 2022. The contents of the above applications are incorporated herein.

BACKGROUND

Technical Field

The present invention relates to an exposure apparatus, a method for manufacturing a device, a method for manufacturing a flat panel display, and an exposure method.

Conventionally, as a scanning exposure apparatus that irradiates a substrate with illumination light via an optical system, an exposure apparatus in which light modulated by a spatial light modulation element passes through a projection optical system and an image formed by the light is formed on a resist coated on a substrate and then exposure is performed is known (for example, refer to Japanese Unexamined Patent Application, First Publication No. 2007-108559).

Here, when a measurement value of calibration or substrate alignment is corrected with respect to digital exposure data for driving the spatial light modulation element, an operation time required for alignment and transmission of correction data is longer than an exposure operation time. Therefore, there has been a demand for an exposure apparatus in which calculation of correction data and transmission of correction data do not affect a cycle time.

SUMMARY

According to an aspect of the present invention, an exposure apparatus that scans and exposes a substrate with an exposure unit having an optical modulator includes a first stage that supports a first substrate, a second stage that supports a second substrate different from the first substrate, a measurement part that measures information about the second substrate, and a generation part that generates control data of an exposure pattern for exposing the second substrate, based on the information, wherein the generation part generates the control data during an exposure process of the first substrate.

According to another aspect of the present invention, an exposure apparatus that scans and exposes a substrate with an exposure unit including an optical modulator includes a first stage that supports a first substrate, a second stage that supports a second substrate different from the first substrate, and a generation part that generates control data of an exposure pattern for exposing the second substrate, wherein the first stage includes an acquisition part that acquires information regarding light of the exposure unit, and wherein the generation part generates the control data based on the information acquired by the acquisition part.

According to yet another aspect of the present invention, an exposure apparatus that scans and exposes a substrate via an optical modulator in which a plurality of elements are controlled according to an image pattern, the exposure apparatus includes a stage that supports a first substrate, a receiving part that receives information about a second substrate, the information being measured by an apparatus different from the exposure apparatus, the second substrate being scanned and exposed by the exposure apparatus after scanning and exposing the first substrate, a generation part that generates control data that controls the plurality of elements during the scanning and exposing the second substrate, based on the information received by the receiving part, and a memory that stores the control data during an exposure process of the first substrate.

An aspect of the present invention includes exposing the substrate using the above-described exposure apparatus, and developing the exposed substrate.

An aspect of the present invention includes exposing a flat panel display substrate using the exposure apparatus, and developing the exposed substrate.

According to an aspect of the present invention, an exposure method that scans and exposes a substrate with an exposure unit having an optical modulator includes supporting a first substrate on a first stage, supporting a second substrate different from the first substrate on a second stage, measuring information about the second substrate, and generating control data of an exposure pattern for exposing the second substrate, based on the information during an exposure process of the first substrate.

According to an aspect of the present invention, an exposure apparatus that scans and exposes a substrate with an exposure unit having an optical modulator includes supporting a first substrate on a first stage including an acquisition part that acquires information regarding light of the exposure unit, supporting a second substrate, which is different from the first substrate, on a second stage, and generating control data of an exposure pattern that exposes the second substrate, based on the information acquired by the acquisition part.

According to an aspect of the present invention, an exposure method that scans and exposes a substrate via an optical modulator in which a plurality of elements are controlled according to an image pattern includes supporting a first substrate on a stage, causing a receiving part to receive information about a second substrate which is measured by an apparatus different from the exposure apparatus which scans and exposes the substrate, the second substrate being scanned and exposed by the exposure apparatus after scanning and exposure with respect to the first substrate has been performed, generating control data that controls the plurality of elements during scanning and exposure of the second substrate, based on the information received by the receiving part, and storing the control data in a memory during an exposure process of the first substrate.

An aspect of the present invention includes a step of exposing the substrate using the above-described exposure method, and developing the exposed substrate.

An aspect of the present invention includes a step of exposing a flat panel display substrate using the above-described exposure method, and developing the exposed substrate.

BRIEF DESCRIPTION OF THE DRAWINGS

FIG. 6 is a side view showing a schematic configuration of a first alignment system provided on a substrate stage.

DESCRIPTION OF THE EMBODIMENTS

Hereinafter, an embodiment will be described in detail with reference to the drawings.

Figure 1:
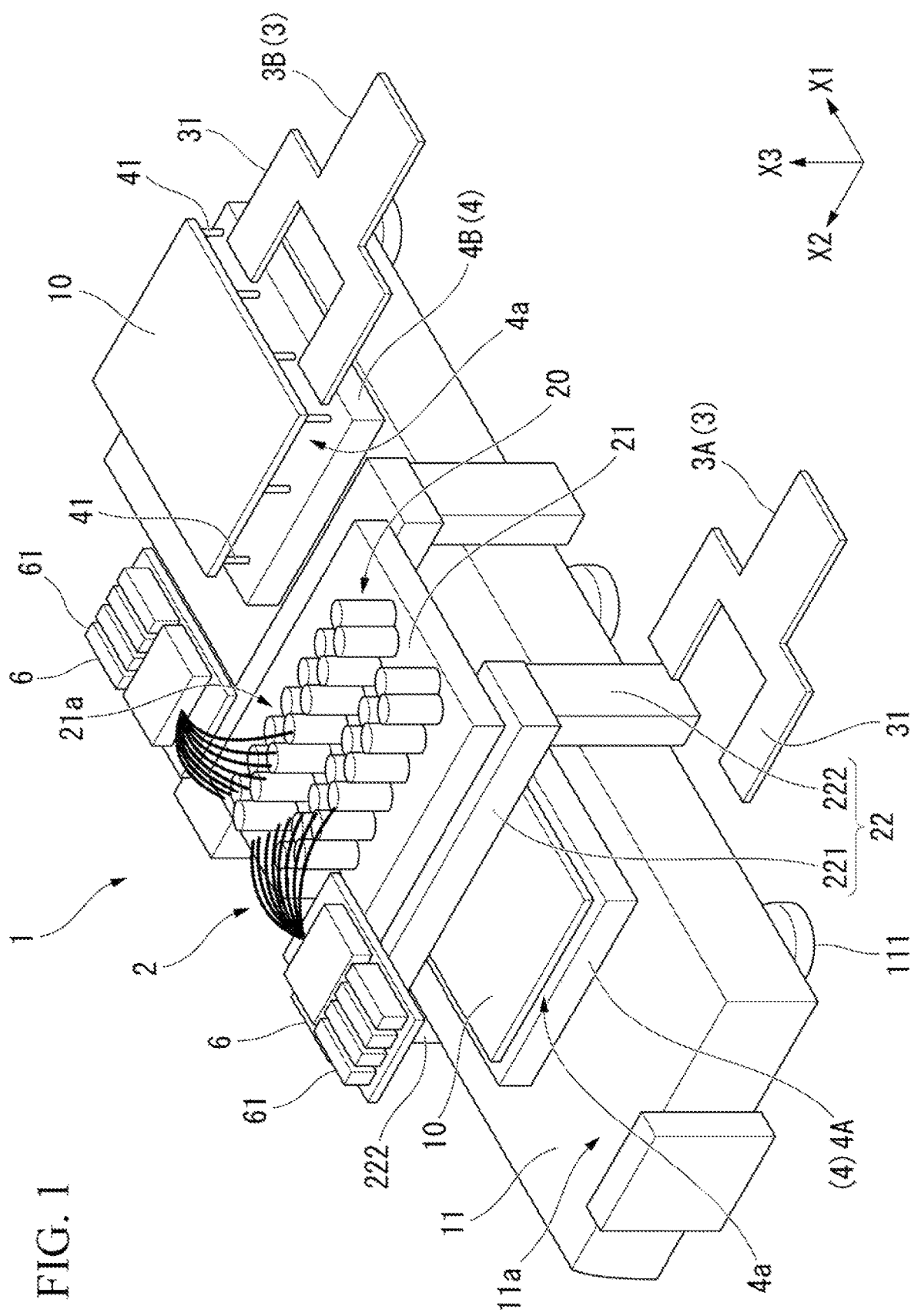
FIG. 1 is a perspective view showing a configuration of an exposure apparatus according to an embodiment.

FIG. 1 is a perspective view showing an example of an exposure apparatus according to this embodiment. The exposure apparatus 1 is an apparatus that irradiates a substrate 10 with illumination light via an optical system. The exposure apparatus 1 passes light modulated by a spatial light modulation element 75 (refer to FIG. 2) through a projection optical system (an illumination and projection module 7 which will be described below), forms an image formed by the light on a photosensitive material (a resist), and performs exposure. The substrate 10 is a display glass substrate coated with, for example, a resist on a surface thereof.

As shown in FIG. 1, the exposure apparatus 1 includes a plurality of (for example, two) substrate stages 4 (4A and 4B) that support the substrate 10, an exposure apparatus main body 2 that performs scanning and exposure to expose the substrate 10 with a predetermined exposure pattern, and a substrate exchange part 3 that transports and places the substrate 10 on the substrate stage 4.

Here, a direction in which the substrate stage 4 is moved during the scanning and exposure of the substrate 10 is indicated by a first direction X1. A direction perpendicular to (crossing) the first direction is defined as a second direction X2. A direction perpendicular to (crossing) the first direction X1 and the second direction X2 is defined as a third direction X3.

The substrate stage 4 holds the substrate 10 which is rectangular in plan view. During the scanning exposure, the substrate stage 4 moves in the first direction X1 with respect to the exposure apparatus main body, as will be described below. Also, the substrate stage 4 moves in the second direction X2 so as to expose each of a plurality of exposure regions on the substrate 10. The second direction X2 is also called a non-scanning direction.

Figure 2:
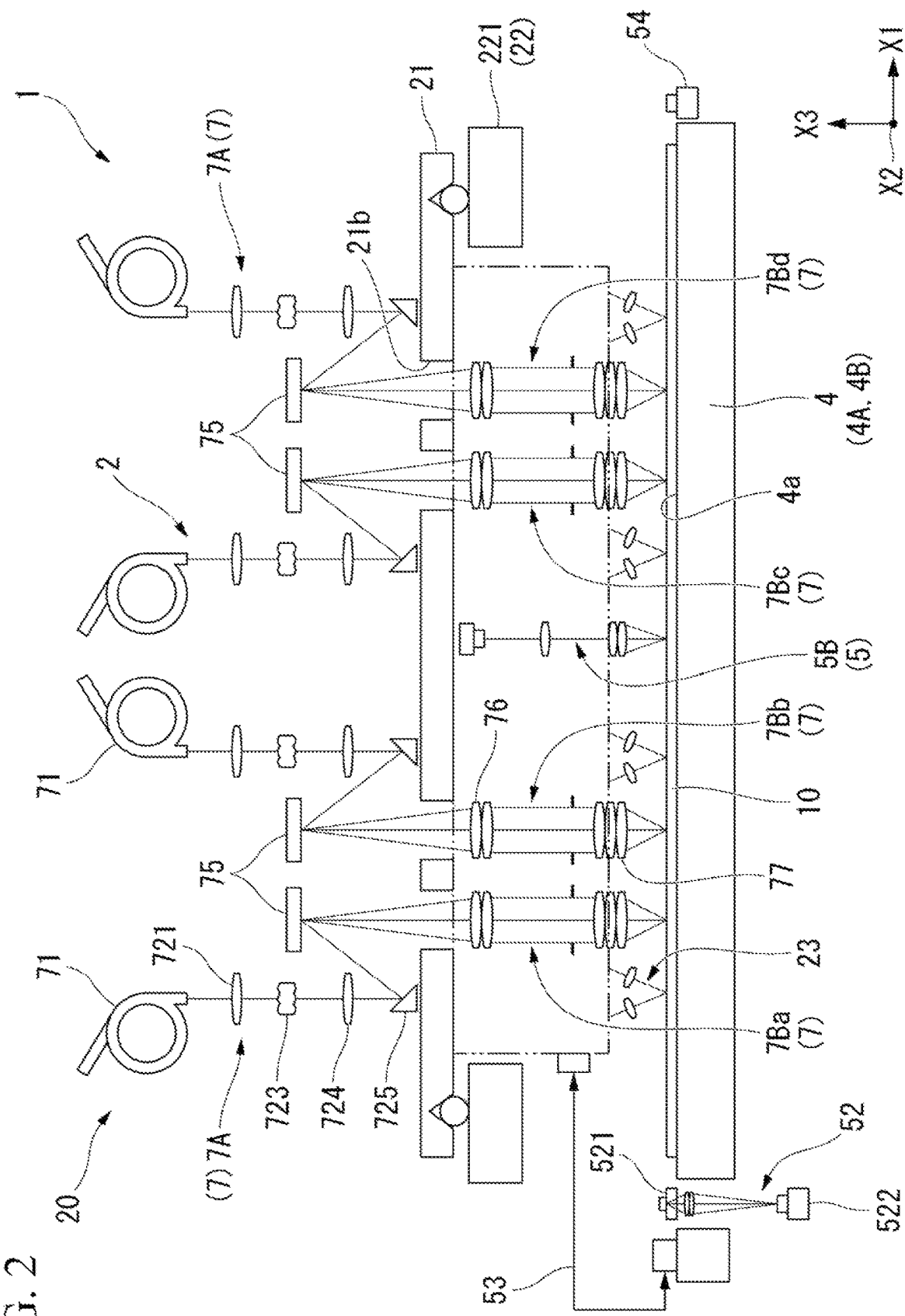
FIG. 2 is a side view showing a schematic configuration of the exposure apparatus.

As shown in FIGS. 1 and 2, the exposure apparatus main body 2 includes an exposure unit 20, an optical surface plate 21, an alignment system 5, and an autofocus system 23. The exposure unit 20 incorporates the spatial light modulation element 75 described above, is supplied with light from a light source 61, and radiates the light in a preset exposure pattern.

The exposure unit 20 is mounted on an optical surface plate 21. The optical surface plate 21 is kinematically supported at three points by a column 22 provided so as to straddle a base plate 11 extending in the first direction X1 on which the substrate stage 4 is placed. The optical surface plate 21 is disposed so that the center of gravity is positioned approximately at a center of the base plate 11 in the first direction X1.

The base plate 11 is installed on a floor via a plurality of anti-vibration bases 111. The base plate 11 is a base extending in the first direction X1, and a pair of stages 4A and 4B which will be described below are mounted on an upper surface 11a thereof. A guide (not shown) that guides the substrate stage 4 in the first direction X1 is provided on the upper surface 11a of the base plate 11.

The column 22 includes a pair of horizontal members 221 that extend in the second direction X2 and legs 222 that extend downward from both ends of the horizontal members 221 and are connected to the base plate 11. Since a load mounted on the optical surface plate 21 is applied to the legs 222, the anti-vibration base (not shown) may be disposed at a joint between the base plate 11 and each of the legs 222. Three V-grooves are formed at appropriate positions on an upper surface of the horizontal member 221. The optical surface plate 21 is placed in the V-groove via three balls on the pair of horizontal members 221 with an upper surface 21a facing in a horizontal direction.

The illumination and projection module 7, an AF system 23, and a second alignment system 5B which will be described below are mounted on the optical surface plate 21. A plurality of first through holes 21b (refer to FIG. 2) penetrating in a thickness direction are provided in the optical surface plate 21 so as to guide exposure light onto the substrate 10. As a method for fixing the optical surface plate 21 to the column 22, any method can be appropriately applied as long as the method can ensure rigidity.

The substrate stage 4 is for positioning the substrate 10 with high accuracy with respect to a plurality of partial images of an exposure pattern projected via a projection module 7B which will be described below. The substrate stage 4 is driven in six degrees of freedom (the first direction X1, the second direction X2, the third direction X3, and θX1, θX2, and θX3 directions rotating around axes X1, X2, and X3).

As shown in FIGS. 1 and 2, the substrate stage 4 includes a first substrate stage 4A disposed on one side of the base plate 11 and a second substrate stage 4B disposed on the other side. The substrate stages 4A and 4B are formed in a planar plate shape, and suction and hold the substrate 10 on upper surfaces 4a thereof by a method such as vacuum suction.

The pair of substrate stages 4A and 4B are guided by a guide (not shown) on the base plate 11, positions of the substrate stages 4A and 4B are measured and controlled by an interferometer 53 or an encoder, and the pair of substrate stages 4A and 4B are moved in the first direction X1 and the second direction X2. As a moving mechanism for the substrate stages 4A and 4B at this time, for example, a linear motor system or the like in which the substrate stage 4 is lifted by air and moved by a magnetic force can be adopted.

A movable range of the first substrate stage 4A and a movable range of the second substrate stage 4B overlap each other. Parts of the movable ranges of each of the substrate stages 4 overlap because they are common without depending on the substrate stages 4A and 4B (particularly, a stroke required for exposure). In this case, it is necessary that each of the substrate stages 4A and 4B are provided to be movable, or a sensor for measuring a distance between the substrate stages 4A and 4B is provided at least at one of the substrate stages 4 so that the first substrate stage 4A and the second substrate stage 4B do not collide or interfere with each other.

A movement path of the substrate stage 4 is set to pass below the exposure unit 20. That is, the substrate stage 4 is configured to be transported to a light irradiation position (also referred to as an exposure position) by the exposure unit 20 and to pass through the irradiation position. Then, while the substrate stage 4 passes through the exposure unit 20, an exposure pattern of an image formed by the exposure unit 20 is exposed onto the substrate 10.

As shown in FIG. 1, a plurality of exchange pins 41 used when the substrate 10 is exchanged are provided on the upper surfaces 4a of the substrate stages 4A and 4B to be retractable in a vertical direction (the third direction X3). The exchange pins 41 are arranged at predetermined intervals in the first direction X1 and the second direction X2 in a region, in which the substrate 10 is disposed, on the upper surface 4a of the substrate stage 4. When the exchange pin 41 protrudes upward, a bottom surface of the substrate 10 is supported by a tip end of each of the pins. In other words, the substrate 10 can be moved up and down by causing the exchange pins 41 to protrude and retract. A protruding length of each of the exchange pins 41 from the upper surface 4a is set to at least a length that allows substrate support portions 31 of exchange arms 3A and 3B, which will be described below, to advance below the moved-up substrate 10.

As shown in FIG. 1, the substrate exchange part 3 unloads the exposed substrate 10 on the substrate stage 4 to the outside of the substrate stage 4, and then loads the substrate 10 to be exposed onto the substrate stage 4 from which the exposed substrate 10 was unloaded. The substrate exchange part 3 includes a first exchange arm 3A for exchanging the substrate 10 on the first substrate stage 4A at high speed, and a second exchange arm 3B for exchanging the substrate 10 on the second substrate stage 4B at high speed. Each of the first exchange arm 3A and the second exchange arm 3B has a loading arm for loading the substrate 10 onto the substrate stage 4 and an unloading arm for unloading the substrate 10. The exchange arms 3A and 3B have the substrate support portions 31 at tip ends of the arms. The exchange arms 3A and 3B are disposed on the sides of the substrate stages 4A and 4B in the second direction X2, and are provided to be movable in the first direction X1, the second direction X2 and the third direction X3. The exchange arms 3A and 3B can be moved in the second direction X2 to advance the substrate support portions 31 below the substrate 10, can be further moved up to support the substrate 10 from below, and can be further moved in the second direction X2 in which the exchange arms 3A and 3B are away from the substrate stages 4A and 4B to take out the substrate 10 from the substrate stages 4A and 4B. A position of the substrate stage 4 on the base plate when the substrate is transported onto the substrate stage 4 by the substrate exchange part is called a substrate exchange position.

The substrate 10 is coated with a photosensitive resist, loaded into the exposure apparatus 1, and placed on the plurality of exchange pins 41 provided on the substrate stages 4A and 4B by the exchange arms 3A and 3B. Then, the exchange pins 41 are moved down so that the substrate 10 is suctioned and held by substrate holders on the substrate stages 4A and 4B. As described above, since the substrate stages 4A and 4B are required to be driven from the substrate exchange position to the exposure position, for example, in the case of a stage measurement system such as the interferometer 53, this can be handled by switching a measurement beam of the interferometer 53 between the exposure position side and the substrate exchange position side.

Figure 3:
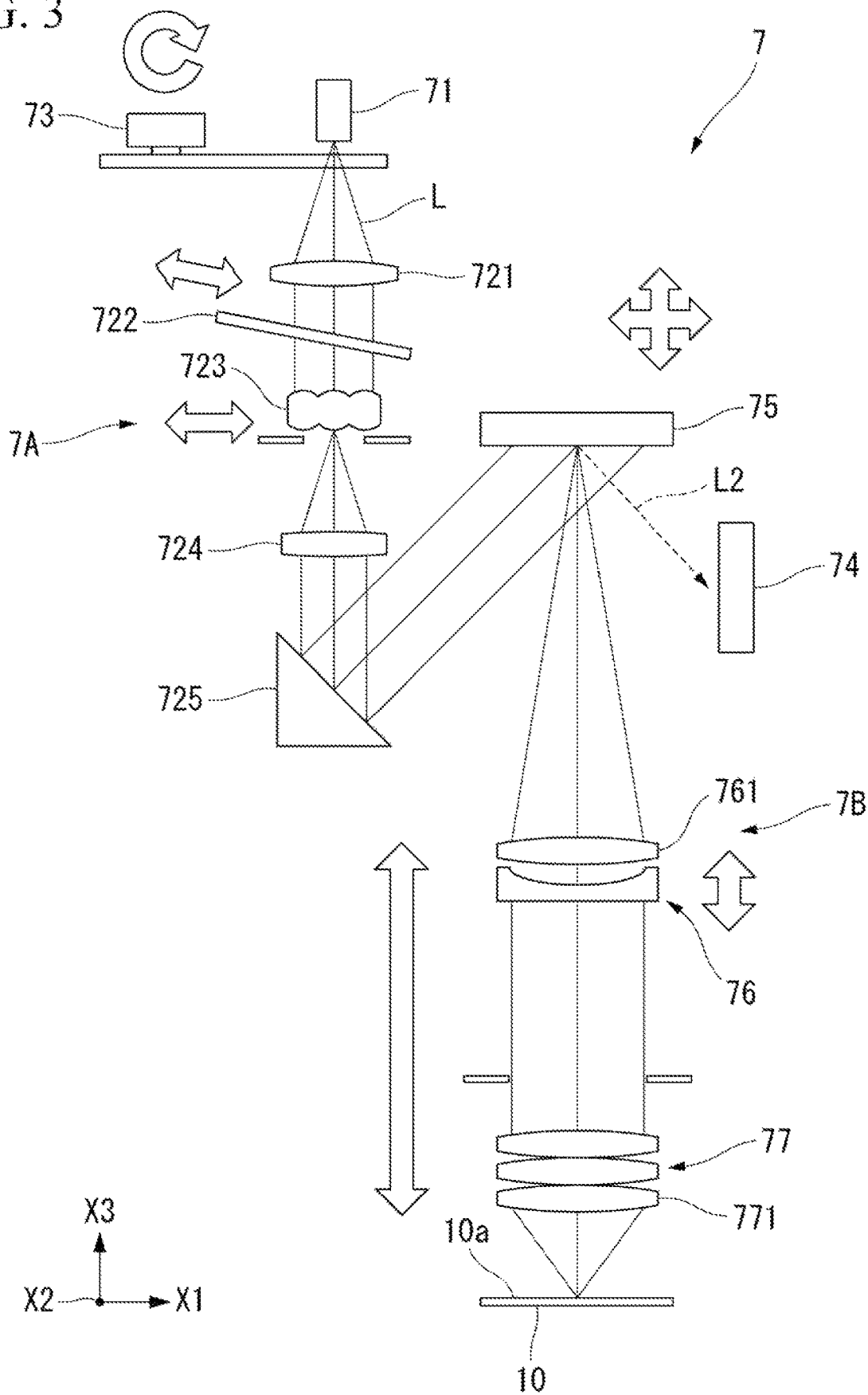
FIG. 3 is a side view showing a schematic configuration of an illumination and projection module of the exposure apparatus.

FIG. 3 is a diagram showing a configuration of the exposure unit 20.

As shown in FIG. 3, the exposure unit 20 includes a light source unit 6 (refer to FIG. 1), a light source 61 of the light source unit 6, and an illumination and projection module 7 for exposing light from the light source 61 using the spatial light modulation element 75 (described below).

As shown in FIG. 1, a pair of light source units 6 are provided. A light source unit using a laser with high coherence as the light source 61, a light source unit using a light source 61 such as a semiconductor laser type UV-LD, and a light source unit using a lens relay type retarder can be employed as the light source unit 6. That is, the light source 61 is a lamp or a laser diode that emits a wavelength of 405 nm or 365 nm, or a laser capable of pulse emission in accordance with driving of the spatial light modulation element 75.

As shown in FIG. 3, an optical system of the illumination and projection module 7 includes an illumination module 7A, a projection module 7B, and a modulation part 7C.

The number of illumination modules 7A is the same as that of the projection modules 7B in a one-to-one relationship. The illumination module 7A introduces laser light L from the light source unit 6 into the illumination module 7A through an optical fiber 71, and substantially uniformly illuminates the spatial light modulation element 75 with the laser light L using a collimator lens 721, a fly-eye lens 723, and a main condenser lens 724.

A module shutter 73 capable of turning ON/OFF the laser light L emitted from the optical fiber 71 at high speed for each of the illumination module 7A and the projection module 7B is disposed in the illumination module 7A.

The illumination module 7A causes the laser light L output from the light source 61 of the light source unit 6 shown in FIG. 1 to be incident on the spatial light modulation element 75 as illumination light for exposure. The illumination module 7A includes, as described above, the optical fiber 71, the collimator lens 721, an illumination wedge 722, the fly-eye lens 723, and the main condenser lens 724. As the optical fiber 71, for example, a quartz fiber is used. The output light (the laser light L) from the light source 61 is guided by the optical fiber 71 and is incident on the collimator lens 721. The collimator lens 721 converts the light that is emitted from the optical fiber 71 and spreads, into parallel light and emits such parallel light. The illumination wedge 722 adjusts intensity (power) of light emitted from the optical fiber 71. The light that has passed through the collimator lens 721 passes through the fly-eye lens 723 and the main condenser lens 724, is reflected by a mirror 725, and is incident on the spatial light modulation element 75 at a predetermined reflection angle. The illumination module 7A and the light source unit 6 can be considered to illuminate the spatial light modulation element 75 by both of them, and the two may be collectively expressed as an illumination system.

The modulation part 7C modulates illumination light to create a pattern, and includes the spatial light modulation element 75 and an OFF light absorption plate 74. A digital mirror device is adopted as an example of the spatial light modulation element 75. The spatial light modulation element 75 includes a plurality of elements (mirrors in the digital mirror device).

Figure 4:
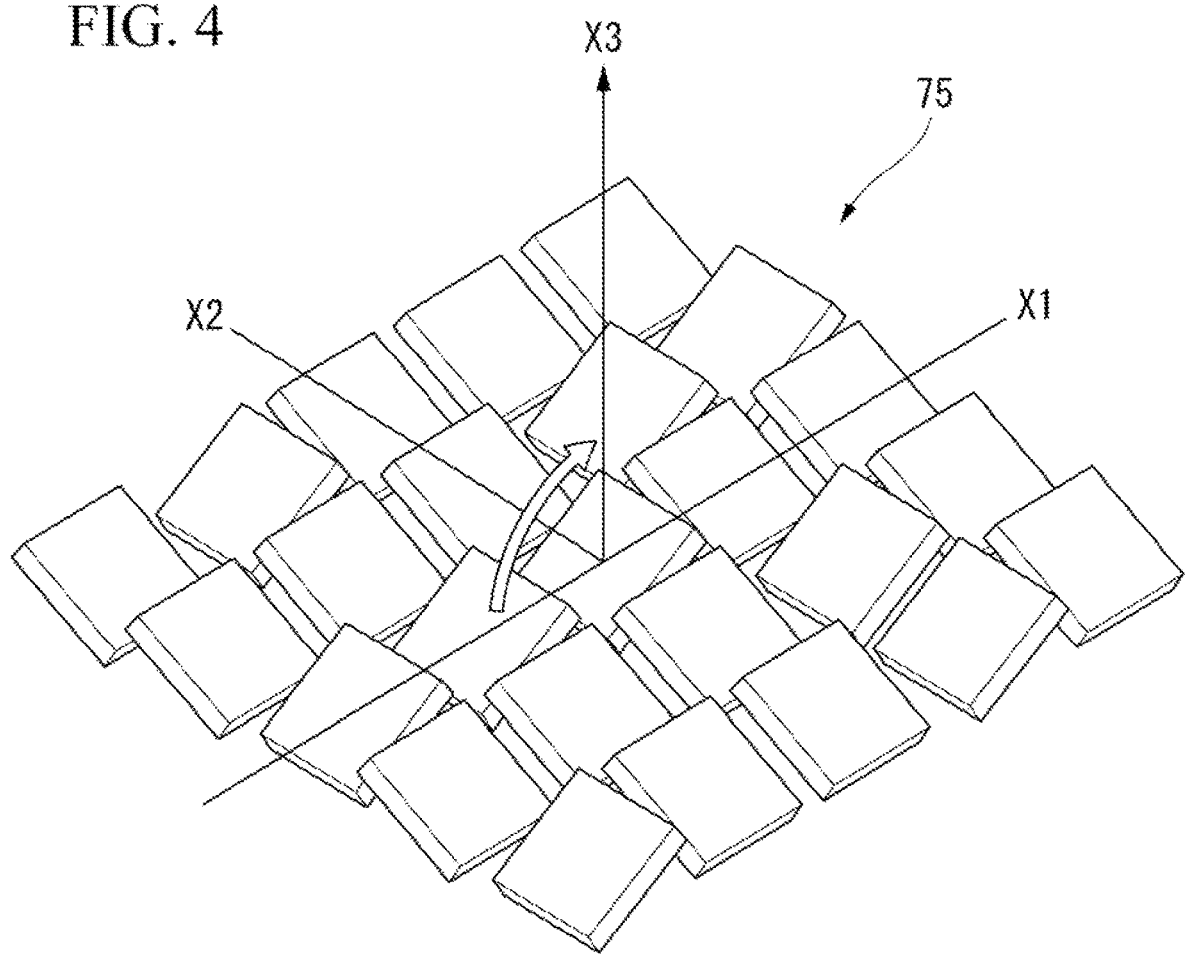
FIG. 4 is a perspective view showing an ON/OFF operation of a spatial light modulation element.

FIG. 4 shows a state in which a predetermined pattern is displayed by turning ON/OFF the spatial light modulation element 75. The individual mirrors of the spatial light modulation element 75 are rotatable around the X1 axis and around the X2 axis.

Figure 5A:
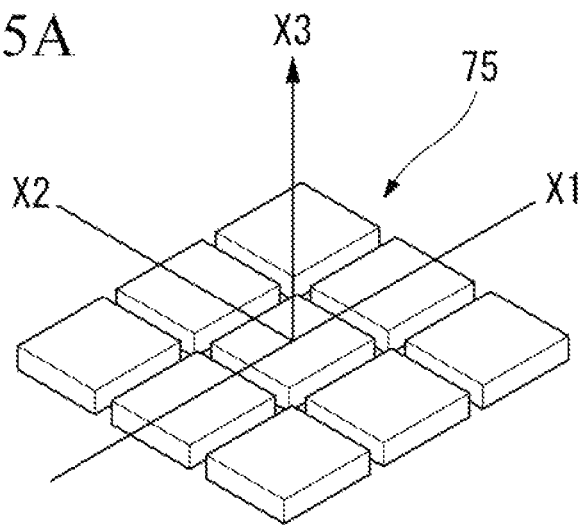
FIG. 5A is a diagram showing an operation of the spatial light modulation element, and is a diagram in a power OFF state.
Figure 5B:
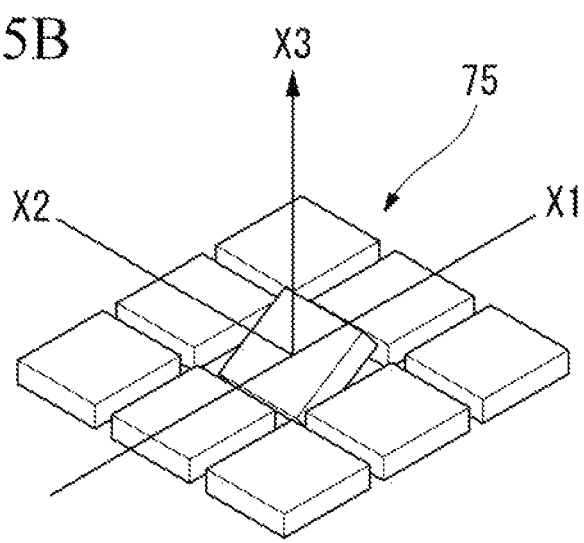
FIG. 5B is a diagram showing the operation of the spatial light modulation element, and is a diagram in an ON state of the spatial light modulation element.
Figure 5C:
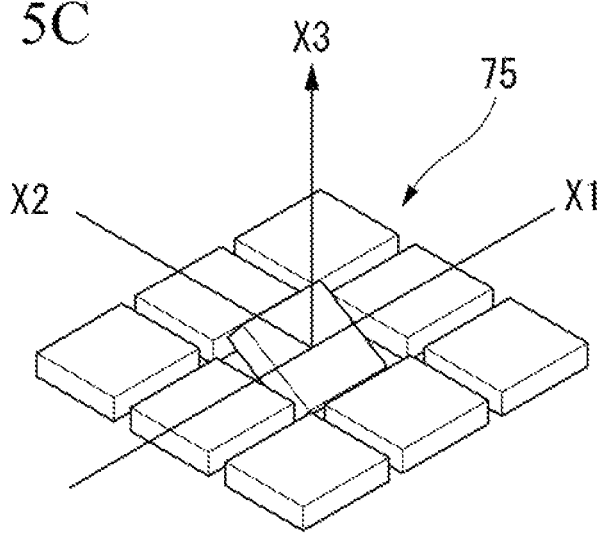
FIG. 5C is a diagram showing the operation of the spatial light modulation element, and is a diagram in an OFF state of the spatial light modulation element.

FIG. 5A shows a state in which the spatial light modulation element 75 is powered off. The spatial light modulation element 75 shown in FIG. 5B shows an ON state in which light from the illumination module 7A is reflected toward the substrate 10 by tilting the mirror around the x2 axis. In addition, the spatial light modulation element 75 shown in FIG. 5C is shown in an OFF state in which the light from the illumination module 7A is turned into OFF light L2 by tilting the mirror around the x1 axis and the light is guided to the OFF light absorption plate 74 instead of the substrate 10. In this way, the spatial light modulation element 75 can control an ON state and OFF state of each of the mirrors based on control data to form a pattern.

The spatial light modulation element 75 can periodically update the pattern on the spatial light modulation element 75 by periodically driving the individual mirrors. Since the light source 61 is required to illuminate the spatial light modulation element 75 every update period of the pattern, it is preferable that the light source 61 emits pulsed light at a constant period or is capable of emitting pulsed light only for a predetermined period. The light source 61 may emit continuous light, and in this case, the light emitted from the light source 61 may be treated as substantially pulsed light by converting continuous light into pulsed light by switching a shutter (not shown) or modulating with an acoustooptic modulator (not shown).

The spatial light modulation element 75 is mounted on a stage (not shown), and is slightly moved in the first direction X1 and/or the second direction X2 in a state in which it is mounted on the stage. As a result, the spatial light modulation element 75 is moved with respect to the illumination light, and a position of a projected image of the pattern on the substrate 10 can be changed, for example, a deviation of a projected position from a target value can be corrected.

As shown in FIG. 2, the projection module 7B is supported by the optical surface plate 21 and disposed below the spatial light modulation element 75 of the modulation part 7C. As shown in FIG. 3, the projection module 7B includes a magnification adjustment part 76 that adjusts a magnification for projecting one pixel of the spatial light modulation element 75 with a predetermined size, and a focus adjustment part 77 that adjusts a focus by driving a lens in the third direction X3.

The projection module 7B projects, exposes, and forms an image of the pattern formed on the spatial light modulation element 75 onto the substrate 10.

The projection module 7B reduces and projects the pattern on the spatial light modulation element 75 onto the substrate 10 at a projection magnification of ½ to ⅒. The projection module 7B can slightly correct the projection magnification by driving a magnification adjustment lens 761 of the magnification adjustment part 76 in the third direction X3. The projection magnification is not limited to reduction, and may be enlargement or equal magnification.

The focus adjustment part 77 includes one or more focus adjustment lenses 771 mainly for adjusting a focus of projection of the spatial light modulation element 75 onto the substrate 10.

As shown in FIG. 2, the projection modules 7B are disposed in multiple rows on the optical surface plate 21 in the first direction X1.

Figure 7:
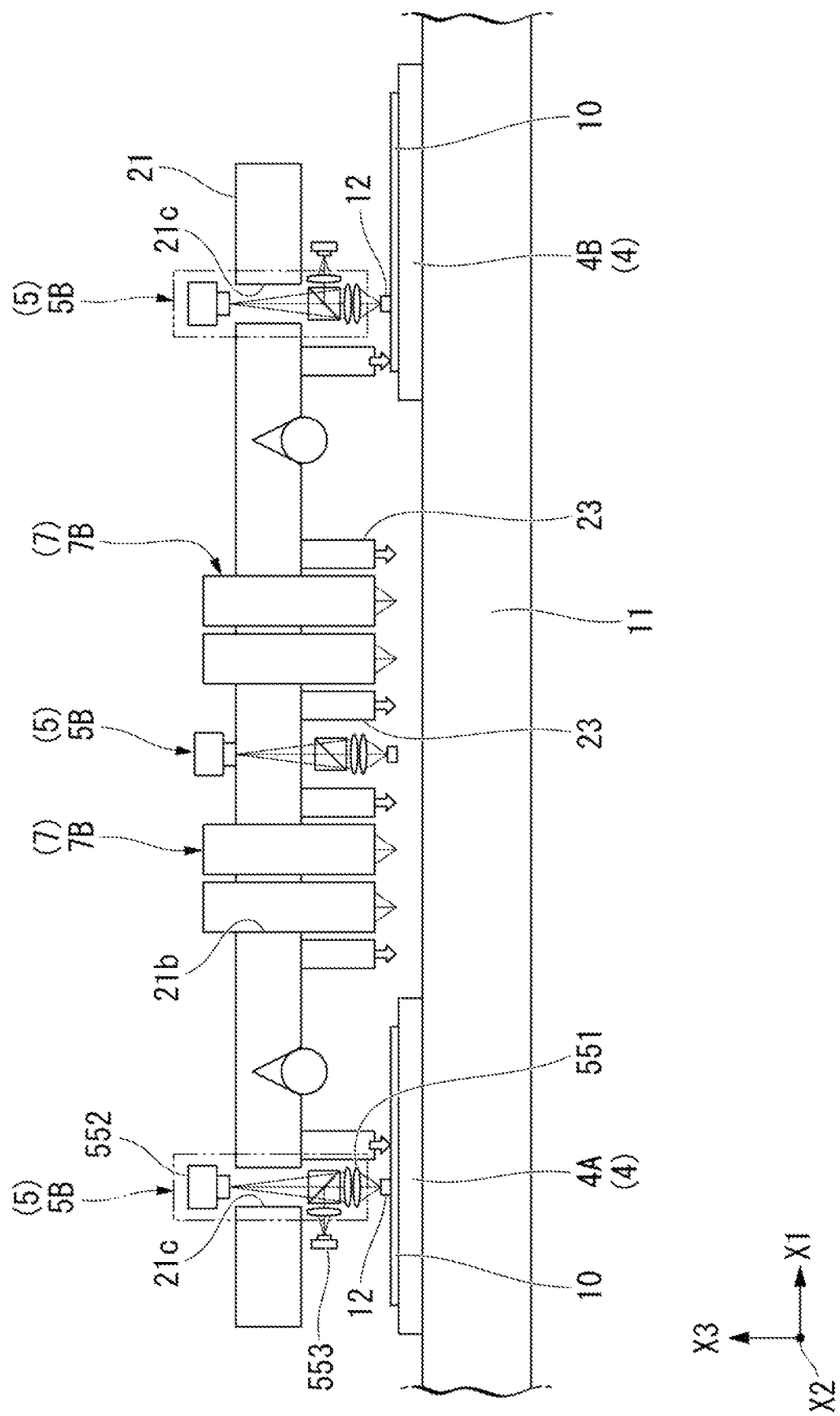
FIG. 7 is a side view showing a schematic configuration of a second alignment system provided on an optical surface plate.

As shown in FIGS. 6 and 7, the alignment system 5 includes at least one of a first alignment system 5A (refer to FIG. 6) provided on the substrate stages 4A and 4B and a second alignment system 5B (refer to FIG. 7) provided on the optical surface plate 21.

As shown in FIG. 6, the first alignment system 5A is embedded in predetermined positions of the substrate stages 4A and 4B. The first alignment system 5A measures a position of the substrate 10 with respect to the substrate stages 4A and 4B. The first alignment system 5A is disposed at four corners of the substrate stage 4, for example. Through holes 42 penetrating in a stage thickness direction at four corners at which the first alignment system 5A is provided are provided in the substrate stage 4.

The first alignment system 5A includes a lens 511 disposed in the through hole 42 of the substrate stage 4A, a light source 513 (for example, an LED) disposed below the lens 511 to radiate measurement light toward an alignment mark 12 of the substrate 10 placed at a predetermined position on the substrate stage 4, and a measurement part 512 that detects light reflected by the alignment mark 12.

In the first alignment system 5A, when the substrate 10 is placed on the substrate stage 4, positions of, for example, the four corners of the substrate 10 are measured, and six parameters (positional information) including a position in the X1 direction, a position in the X2 direction, an amount of rotation ($\theta$X3), a reduction and enlargement magnification in the X1 direction, a reduction and enlargement magnification in the X2 direction, and orthogonality can be measured and calculated.

The arrangement of the first alignment system 5A on the substrate stage 4 is not limited to the four corners as described above. For example, when it occurs due to a process such as a non-linear shape of the substrate 10, a considerable number of first alignment systems 5A, such as 4 locations×4 rows, are disposed. Since the first alignment system 5A is a unit different from the projection module 7B, it can be said that it is an off-axis alignment system.

The first alignment system 5A performs measurement based on pixels of a camera of the measurement part 512.

As shown in FIG. 2, on the optical surface plate 21, the AF systems 23 are disposed on both sides of the projection module 7B in the first direction X1 (refer to FIG. 7). The AF system 23 can measure the position of the substrate 10 in the X3 direction prior to an exposure process regardless of a scanning direction of the substrate 10 (the first direction X1). The focus adjustment part 77 drives the focus lens 771 based on measurement results of the AF system 23 and adjusts the focus of the pattern image of the spatial light modulation element 75.

Further, as shown in FIG. 2, the substrate stage 4 includes a calibration measurement system 52, the interferometer 53 for measuring the position of the substrate stage 4, and an illuminance measurement device 54.

The calibration measurement system 52 is used for measuring and calibrating positions of various modules. The calibration measurement system 52 is also used for calibrating the second alignment system 5B disposed on the optical surface plate 21.

Thus, in the exposure apparatus 1 of this embodiment, since an imaging position of the pattern generated by the spatial light modulation element 75 that performs exposure is measured with the first alignment system 5A in the substrate stage 4, a position of the first alignment system 5A on the substrate stage 4 with respect to an imaging system can be measured by an image position of the interferometer 53 and the alignment system 5 for measuring the position of the substrate stage 4.

Further, as shown in FIG. 7, on the optical surface plate 21, the second alignment system 5B may be disposed at a position above each of the first substrate stage 4A and the second substrate stage 4B.

The second alignment system 5B measures the position of the substrate 10 with respect to the substrate stages 4A and 4B. The second alignment system 5B is disposed in a second through hole 21c that penetrates the optical surface plate 21 in the thickness direction. In the case of a configuration in which the position of the substrate 10 with respect to the substrate stages 4A and 4B is measured by the second alignment system 5B, the first alignment system 5A may not be provided at the first substrate stage 4A and the second substrate stage 4B.

The second alignment system 5B includes a lens 551 disposed below the second through hole 21c of the optical surface plate 21, an optical sensor 552 that is disposed above the lens 551 and radiates measurement light toward the alignment mark 12 of the substrate 10 which is placed at a predetermined position on the substrate stage 4, and a measurement part 553 that detects light reflected by the alignment mark 12.

When the substrate 10 is placed on the substrate stage 4, like the first alignment system 5A, the second alignment system 5B can measure and calculate the six parameters (the positional information) regarding the substrate 10 including the position in the first direction X1, the position in the second direction X2, the amount of rotation (θX3), the reduction and enlargement magnification in the first direction X1, the reduction and enlargement magnification in the second direction X2, and orthogonality. Further, the second alignment system 5B can calculate a nonlinear component of deformation of the substrate 10, or the six parameters (the positional information) in a predetermined exposure region (for example, an exposure region divided into four) by measuring not only the entire substrate 10 but also a partial region.

The optical surface plate 21 is formed to extend in the first direction X1. The second alignment system 5B is provided on the optical surface plate 21 apart from the illumination and projection module 7 in the first direction X1. The substrate stage 4 moves the alignment mark 12 of the substrate 10 to a position (an alignment measurement position) at which the second alignment system 5B can measure. The arrangement of the alignment marks 12 provided on the substrate 10 can be given a certain degree of freedom in the measurement.

Further, the optical surface plate 21 supports an alignment system CE (the second alignment system 5B) provided between the projection modules 7B provided apart from each other in the first direction X1. When the alignment marks on the substrate 10 are measured by the second alignment systems 5B located at both ends, the interferometer that measures the position of the substrate stage 4 is required to be switched with an interferometer for exposure at the exposure position, and thus the alignment system CE is disposed to measure the position of the substrate 10 or the substrate stage 4 at the exposure position.

The exposure apparatus 1 is connected to and controlled by a data controller having a memory. The data controller is connected to each part of the exposure apparatus 1 (the alignment system 5 (5A, 5B), the substrate stage 4, the optical system (the illumination module 7A, the projection module 7B and the modulation part 7C)), and transmits and receives measured values, or issues control operation commands to the exposure apparatus 1, and the like. The data controller has a function of generating and correcting control data for driving the spatial light modulation element 75 by measurement, and stores correction data of the control data in the memory.

Next, a method for continuously exposing the substrate 10 will be described with reference to the drawings.

First, as shown in FIG. 1, when a recipe for exposure is input to the exposure apparatus 1, mask data (pattern data, image data) for exposure is selected from a mask pattern server. Then, the data controller divides the mask data into the number of illumination and projection modules 7, generates control data from the divided mask data, and stores the control data in the memory. At this time, for example, since the spatial light modulation element 75 updates 4M pixels at an update rate of approximately 10 kHz, the memory stores a large amount of control data at high speed. The data controller transmits the control data stored in the memory to each of the plurality of illumination and projection modules 7. Upon receiving the control data, the illumination and projection module 7 performs various exposure preparations. The illumination and projection module 7 loads the received mask data into the spatial light modulation element 75.

First, the exposure apparatus 1 measures and calibrates an illuminance (light information) according to the recipe. For example, the illuminance measurement device 54 disposed on the first substrate stage 4A measures the illuminance of light from an illuminance measurement pattern generated on the spatial light modulation element 75. The exposure apparatus 1 performs adjustment of the illuminance so that an illuminance difference between the illumination and projection modules 7 is eliminated by the illumination wedge 722 disposed in the illumination module 7A using the measurement results of the illuminance measured using each of the plurality of illumination and projection modules 7.

The exposure apparatus 1 measures the exposure positions of the second alignment system 5B, the illumination module 7A and the projection module 7B disposed on the optical surface plate 21 using the calibration measurement system 52.

That is, the calibration measurement system 52 measures the arrangement of the illumination module 7A and the projection module 7B and the position of the second alignment system 5B, and calculates a relative positional relationship between the illumination module 7A and the projection module 7B and the second alignment system 5B.

As shown in FIG. 2, the position of the first alignment system 5A provided on the first substrate stage 4A is measured based on pixels of a camera of the measurement part 512. The first alignment system 5A performs measurement using the exposure pattern of the spatial light modulation element 75 projected by the projection module 7B. The exposure apparatus 1 calculates the relative positional relationship between the illumination module 7A and the projection module 7B, and the first alignment system 5A based on the measurement results. The exposure apparatus 1 also calculates the relative positional relationship between the illumination module 7A and projection module 7B, and the first alignment system 5A by the same method for the second substrate stage 4B. In this way, the exposure apparatus 1 calculates the relative positional relationship between the illumination module 7A and the projection module 7B, and the alignment system 5.

Next, as shown in FIG. 6, the substrate exchange part 3 places the substrate 10 on the first substrate stage 4A. At this time, the first alignment system 5A observes and measures the alignment mark 12 of the substrate 10, and calculates the relative position between the devices of the first alignment system 5A and the substrate 10. Alternatively, the first substrate stage 4A moves below the second alignment system 5B, and the second alignment system 5B observes and measures the alignment mark 12 of the substrate 10, and calculates the relative position between the devices of the second alignment system 5B and the substrate 10. Thus, the position on the substrate at which the pattern will be exposed, that is, the projection position can be known based on the previously calculated relative positional relationship between the illumination module 7A and the projection module 7B, and the alignment system 5, and the relative position between the substrate and the alignment system 5.

With this operation, an amount of deviation between the position to be exposed on the recipe and the position to be exposed on the substrate 10 based on the current arrangement relationship between the substrate 10 and the projection module 7B is known. In this embodiment, the data controller corrects the exposure data (the mask data, the pattern data, the control data) in order to correct the amount of deviation. The exposure apparatus 1 not only may perform the correction of the exposure data by the data controller to correct the amount of deviation, but also may move the substrate stage 4 itself to reduce the amount of deviation and then to generate and correct the correction data by the data controller. In this case, an amount of correction in data correction by the data controller can be reduced. The exposure apparatus 1 may change the exposure position on the substrate 10 by moving the stage on which the spatial light modulation element 75 is mounted. The exposure apparatus 1 may correct the amount of deviation by performing the data correction by the data controller and the correction of the exposure position by moving the substrate stage 4, may correct the amount of deviation by performing the data correction by the data controller and the correction of the exposure position by moving the spatial light modulation element 75, and may correct the amount of deviation by the data correction by the data controller, the correction of the exposure position by moving the substrate stage 4, and the correction of the exposure position by moving the spatial light modulation element 75.

In the exposure apparatus 1, it is also possible to calculate a correction value for each panel, such as a liquid crystal television, on the substrate 10 and to obtain a correction value for the substrate stage 4. When the substrate 10 is partially corrected in this way, the correction values are almost always different between the illumination module 7A and the projection module 7B, thus the correction value is calculated for each of the illumination module 7A and the projection module 7B, and digital exposure data for exposure is corrected.

Figure 8:
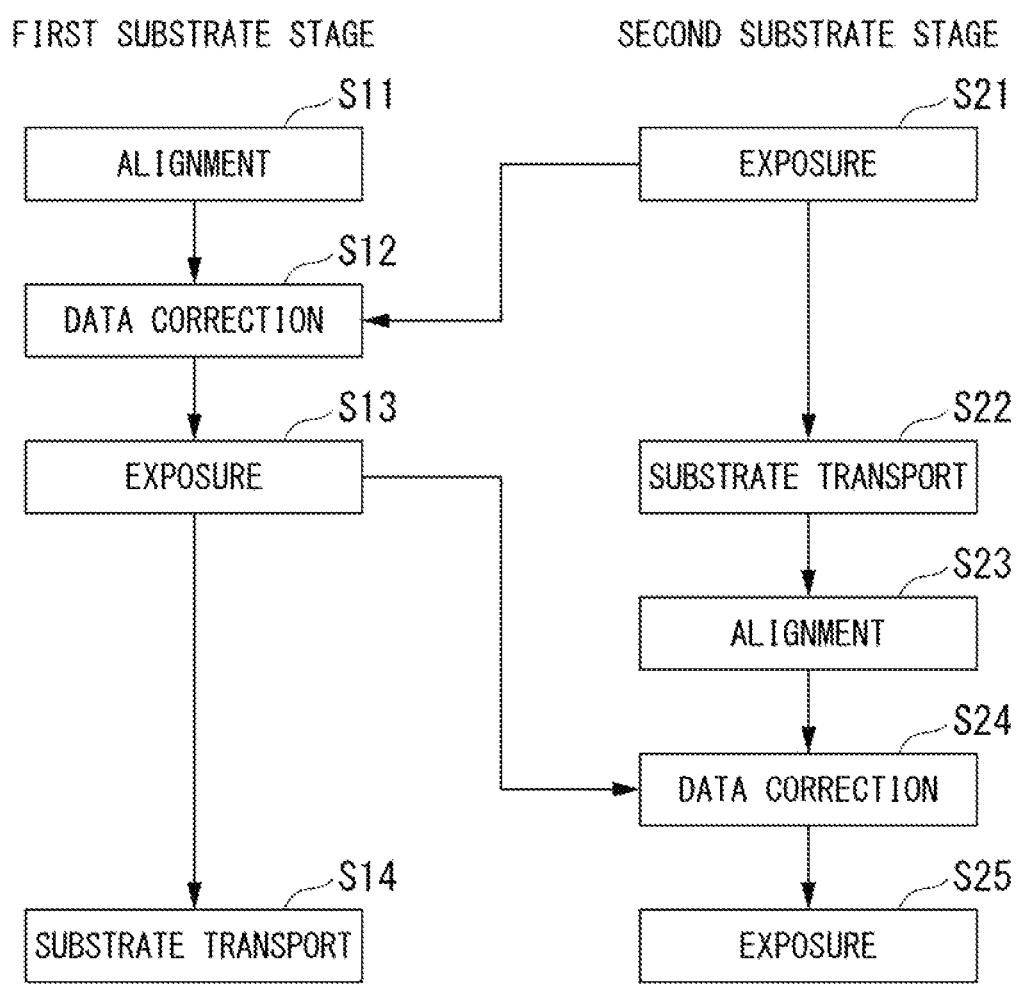
FIG. 8 is a diagram showing an example of an operation flow of an exposure process of the exposure apparatus.

A flowchart shown in FIG. 8 shows an example of an operation flow that performs both an exposure operation and a correction data creation operation for creating correction data in each of the first substrate stage 4A and the second substrate stage 4B.

As shown in FIG. 8, the first substrate stage 4A uses the first exchange arm 3A (refer to FIG. 1) of the substrate exchange part 3 to place the substrate 10 (referred to as a first substrate) on the first substrate stage 4A. Then, the alignment system 5 measures the alignment mark 12 on the first substrate 10 (Step S11).

Next, after Step S11, the data controller described above calculates a correction value (the correction data) for the digital exposure data (Step S12). Then, the data controller stores the correction data obtained in Step S12 in the memory and transmits it to the illumination and projection module 7. Then, the exposure apparatus 1 performs overlapping exposure on the first substrate 10 on the first substrate stage 4A based on the transmitted correction data and recipe information for the first substrate 10 (Step S13).

After the preceding exposure operation (Step S21) is completed on the second substrate stage 4B, the exposure apparatus 1 performs the exposure operation for the first substrate 10 by the above-described first substrate stage 4A. During the exposure operation for the first substrate 10 by the first substrate stage 4A, the exposure apparatus 1 unloads the substrate 10 exposed in Step S21 from the second substrate stage 4B, and transports a new substrate 10 (referred to as a second substrate) to the second substrate stage 4B (Step S22). At least one of the operation of unloading the exposed substrate from the first substrate stage 4A and the operation of loading the substrate 10 to be exposed next onto the first substrate stage 4A will be collectively referred to as a substrate transport operation. Then, the first alignment system 5A and/or the second alignment system 5B measures the alignment mark 12 on the second substrate 10 (Step S23).

Calibration of errors due to switching of the first alignment system 5A, the second alignment system 5B, the alignment system CE, and the interferometer is performed by calibration using stage marks or substrate marks.

In the data controller, the correction data used for the exposure performed next on the second substrate stage 4B, that is, the exposure for the second substrate 10, that is, the correction value (the correction data) of the digital exposure data for driving the spatial light modulation element 75 is calculated based on the alignment measurement results in Step S22 (Step S24). Then, the data controller stores the correction data obtained in Step S24 in the memory and transmits it to the illumination and projection module 7. Then, the exposure apparatus 1 performs overlapping exposure for the second substrate 10 on the second substrate stage 4B based on the transmitted correction data and recipe information for the second substrate 10 (Step S25). The exposure apparatus 1 unloads the first substrate 10 placed on the first substrate stage 4A and exposed in Step S13 from the first substrate stage 4A in parallel with the overlapping exposure for the second substrate 10.

In this way, since the exposure apparatus 1 includes the plurality of substrate stages 4, during the exposure process of the first substrate 10 performed on one of the first substrate stages 4A, the exposure apparatus 1 can perform processing steps from the alignment measurement of the second substrate 10 to generation of the correction data and data transmission using the first alignment system 5A and/or the second alignment system 5B in the other second substrate stage 4B. Thus, occurrence of cycle delay can be suppressed.

Here, "during the exposure process" is a process including the operation in which the substrate stage 4 moves from the exchange position to the alignment measurement position, the exposure operation with respect to the substrate 10, and the operation in which the substrate stage 4 moves to the exchange position after the exposure operation with respect to the substrate 10 is completed. The exposure operation is either an operation of performing scanning exposure for the substrate 10 or an operation of moving the substrate stage 4 in the X1 direction or the X2 direction to change the exposure region in which the scanning exposure is performed.

In the operation of performing the data correction in the first substrate stage 4A and the second substrate stage 4B, it is also possible to perform calibration and the like (for example, measurement of orthogonality of the substrate stage, and the like) during the data correction.

The data controller may calculate the correction data when the substrate 10 placed on the first substrate stage 4A is exposed, for example, using light information such as an illuminance measured by the illuminance measurement device 54 and the calibration measurement system 52 provided on the second substrate stage 4B during the exposure process. The data controller may calculate the correction data using only the light information, or may calculate the correction data using the measurement results of the alignment system 5 and the light information.

Further, in the exposure apparatus 1, the calculation of the correction value based on data and the transmission of the correction data can be performed during the exposure operation by performing the measurement related to the exposure position and the data correction in advance together with the arrangement measurement of the plurality of illumination modules 7A and the projection modules 7B and then performing the measurement of the illuminance and correction of bending (straightness) of the movable mirror 13 provided on the substrate stage 4. In this way, it is possible to transmit the data considering the alignment of the substrate 10 and the arrangement of the modules without affecting the cycle time.

Here, a case in which the exposure apparatus has only one substrate stage and a case in which the exposure apparatus has a plurality of substrate stages like the exposure apparatus 1 of this embodiment are compared. When the exposure apparatus has only one substrate stage, the exposure apparatus performs alignment using the alignment system 5, calculates the correction value using the results in the data controller, and generates the correction data, and after completion of the transmission, the substrate is exposed. In this case, after the alignment is performed, the exposure apparatus may be in a state in which the substrate cannot be exposed, that is, waiting for exposure, until the generation of the correction data and the transmission of the correction data are completed. For example, when a total time from the exposure of the substrate on the substrate stage until the exposed substrate is unloaded from the substrate stage (or a time required for the substrate stage to move from the exposure position to the substrate exchange position) takes, for example, 100 seconds, and it takes 50 seconds, which is half of the time (100 seconds) required until the substrate is unloaded, to perform loading of the substrate onto the substrate stage before the substrate on the substrate stage is exposed, the alignment measurement for the substrate, the creation of the correction data, and the transmission of the correction data, it takes 150 seconds, which is the sum of both the times, to load one substrate 10 onto the substrate stage 4 and then to expose and unload the substrate 10. In other words, the exposure apparatus starts the exposure process 50 seconds after the substrate is loaded onto the substrate stage. Even when an attempt is made to shorten a time from the substrate being loaded onto the substrate stage to a transmission time and to shorten a series of cycle time (150 seconds in the above example) from loading to unloading of a single substrate, since the time cannot be set to 0, it affects the cycle time. From the completion of exposure of the first substrate to the start of exposure of the second substrate, it takes time (t1+t2+t3) which is the sum of a time (t1) from exposure of the first substrate to unloading, a time (t2) for loading the second substrate onto the substrate stage, and a time (t3) required for the alignment operation/the generation of the correction data/the transmission of data for the second substrate.

On the other hand, according to the exposure apparatus 1 of this embodiment, it is possible to improve work efficiency in exposure by providing the plurality of (two in this embodiment) substrate stages 4A and 4B. Specifically, the exposure of the second substrate 10 can be started immediately after the exposure of the first substrate 10 is completed by performing all operations of the unloading of the exposed substrate 10, the loading of the second substrate 10, and the alignment operation/the generation of the correction data/the transmission of data on the other stage (for example, the second substrate stage 4B) while the first substrate 10 on one of the substrate stages 4A and 4B (for example, the first substrate stage 4A) is being exposed. It is possible to reduce the time (the time t1+t2+t3 described above) required from the completion of exposure of the first substrate to the start of exposure of the next substrate when the exposure apparatus has only one substrate stage, as described above. In the above example, the cycle time of 150 seconds can be reduced to 100 seconds or less (only the time for the exposure operation in 100 seconds). Thus, in the exposure apparatus 1 of this embodiment, a waiting time for exposure which occurs in the exposure apparatus having only one substrate stage can be eliminated.

Further, the data controller requires a memory for transmitting data for exposure to the spatial light modulation element 75 and a memory for storing data for performing exposure with alignment of the second substrate 10B taken into account. For example, a large-capacity memory may include a region for storing data for the first substrate stage 4A and a region for storing data for the second substrate stage 4B. Preferably, in consideration of the delay due to simultaneous processing of data reading and writing, the data controller may have individual memories, and a switcher for switching the memory to finally perform transmission to the spatial light modulation element 75 may be used.

Figure 9:
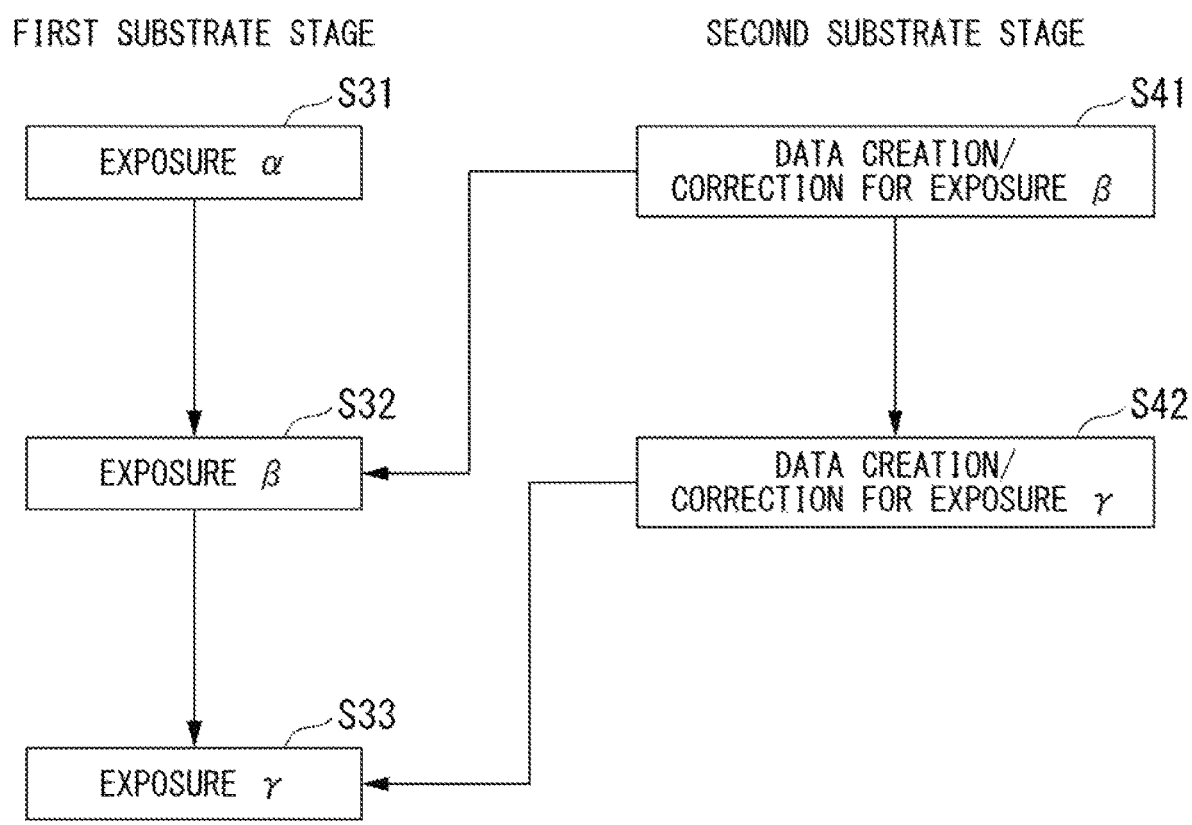
FIG. 9 is a diagram showing a modified example of the operation flow of the exposure process of the exposure apparatus.

Although the above describes the operation flow of performing both the exposure operation and the alignment operation for data correction in each of the first substrate stage 4A and the second substrate stage 4B, it is also possible to adopt an operation flow according to a modified example shown in FIG. 9.

Modified Example

In an exposure operation flow in an exposure apparatus 1 according to the modified example shown in FIG. 9, the first substrate stage 4A is provided exclusively for the exposure operation, and the second substrate stage 4B is provided exclusively for the alignment operation and the data correction operation. Therefore, the first alignment system 5A is provided only on the second substrate stage 4B. A configuration of the data controller according to the modified example is the same as that in the above embodiment. The substrate stage 4 may be disposed so that a movable range of the first substrate stage 4A and a movable range of the second substrate stage 4B do not overlap.

In the first substrate stage 4A, a first exposure α is performed on a first substrate in Step S31 in chronological order, after the first exposure α, a second exposure β is performed on a second substrate in Step S32, and after the second exposure β, a third exposure γ is performed on a third substrate 10 in Step S33.

As shown in FIG. 9, in Step S41, on the second substrate stage 4B, while the first exposure α for the first substrate 10 on the first substrate stage 4A is being performed, the alignment operation on the second substrate 10 for the second exposure β which is performed subsequent to the first exposure α is performed by the first alignment system 5A, and correction data is created by the data controller.

Specifically, on the second substrate stage 4B, the second substrate 10 is mounted on the second substrate stage 4B using the first exchange arm 3A (refer to FIG. 1) of the substrate exchange part 3. Then, the alignment mark 12 of the second substrate 10 is measured by the first alignment system 5A. The data controller calculates a correction value (the correction data) for the digital exposure data for driving the spatial light modulation element 75 through measurement by the first alignment system 5A. Then, the data controller stores the obtained correction data in the memory.

Next, when the exposure α is completed on the first substrate stage 4A, the exposed first substrate 10 is unloaded from the first substrate stage 4A using the substrate exchange part 3 shown in FIG. 1. Then, the second substrate 10 for which the correction data has been created in Step S41 is exchanged from the second substrate stage 4B to the first substrate stage 4A using the substrate exchange part 3.

When the second substrate 10 is exchanged from the second substrate stage 4B to the first substrate stage 4A, the first substrate stage 4A moves to detect the alignment mark 12 with the second alignment 5B, and grasps a position of the second substrate 10 with respect to the first substrate stage 4A. Alternatively, the first alignment 5A measures and grasps the position of the second substrate 10 with respect to the first substrate stage 4A.

In the modified example, since the substrate 10 is exchanged between the first substrate stage 4A and the second substrate stage 4B, the correction data generated based on the positional relationship between the second substrate stage 4B and the second substrate 10 (before exchanging) cannot be used as it is. This is because the positional relationship between the second substrate stage 4B and the second substrate 10 (before being exchanged to first substrate stage 4A) is different from the positional relationship between the first substrate stage 4A and the second substrate 10 (after being exchanged to first substrate stage 4A). Therefore, when the positional relationship between the first stage 4A and the second stage 4B is measured in advance and the position of the substrate 10 with respect to the stages 4A and 4B before and after exchanging (the position obtained by measuring the alignment marks 12) is known, a relative comparison can be made between the positional relationship between the second substrate stage 4B and the second substrate 10 (before being exchanged to the first substrate stage 4A) and the positional relationship between the first substrate stage 4A and the second substrate (after being remounted on the first substrate stage 4A). Here, as shown in FIG. 7, only the predetermined number of points on the substrate 10 are measured by the second alignment system 5B (the alignment system CE) provided between the projection modules 7B provided apart from each other in the first direction X1, positional deviation including rotation of the substrate 10 due to transfer from the first substrate stage 4A to the second substrate stage 4B is measured, and the projection position is corrected by the stage holding the substrate stage 4 and the spatial light modulation element 75 in substantially the same state as the state in which the data correction is created.

Then, in the first substrate stage 4A, in Step S32, the second exposure β is performed on the second substrate 10 on the first substrate stage 4A based on the second substrate correction data and recipe information transmitted from the data controller (Step S32). The correction data may be further corrected by the amount of deviation found by the relative comparison. The position of the stage and/or the position of the spatial light modulation element 75 may be adjusted while the correction data is further corrected.

Furthermore, in Step S42, while the second exposure β is being performed with respect to the second substrate 10 on the first substrate stage 4A, alignment is performed on the second substrate stage 4B by the alignment system 5 with respect to the third substrate 10 for the third exposure γ which is performed subsequent to the second exposure β, and correction data is created by the data controller.

Specifically, on the second substrate stage 4B, the first exchange arm 3A (refer to FIG. 1) of the substrate exchange part 3 is used to place the third substrate 10 on the second substrate stage 4B. Then, the alignment mark 12 of the third substrate 10 is measured by the alignment system 5. The data controller calculates a correction value (the correction data) for the digital exposure data for driving the spatial light modulation element 75 through measurement by the alignment system 5. Then, the data controller stores the obtained correction data in the memory.

Thereafter, the same operations are sequentially repeated on the first substrate stage 4A and the second substrate stage 4B.

As described above, in the exposure operation according to the modified example, during the exposure process of the substrate 10 performed on the first substrate stage 4A dedicated to exposure which is one of the plurality of (here, two) substrate stages 4A and 4B, a processing step from the alignment of the substrate 10 to the transmission of data are performed using the first alignment system 5 on the other second substrate stage 4B dedicated to the alignment and the data correction, and the correction data can be transmitted. Thus, it is possible to curb the occurrence of cycle delays.

In the modified example, the substrate 10 is transferred between the first substrate stage 4A dedicated to the exposure and the second substrate stage 4B dedicated to the alignment and the data correction in the exposure apparatus 1. However, the second substrate stage 4B does not have to be provided in the exposure apparatus 1, and may be provided in an apparatus different from the exposure apparatus 1. For example, when the number of alignment marks 12 to be measured in alignment measurement is large and the creation of the correction data by the data controller is not completed before the exposure of the next substrate 10 is started, or when the number of alignment points is large in order to correct non-linearity and the like, it is preferable to provide the second substrate stage 4B in an apparatus different from the exposure apparatus 1. Another apparatus is, for example, a coater that applies a photosensitive material (resist) to the substrate 10 or an apparatus that is located upstream of the coater and performs a predetermined process on the substrate 10. It is possible to earn more time between a process of actually measured data (the creation of the correction data) and the exposure by performing detailed alignment measurement using another apparatus. The exposure apparatus 1 has a receiving part that receives measurement results by another apparatus. The data controller uses the received data to create the correction data. In this case, the memory of the data controller requires three storage units including a storage for the data of the substrate being exposed, a storage for the data of the substrate 10 that has been processed by another apparatus and has already been measured, and a storage for the data that is being measured now. The data controller selectively reads data according to the substrate.

That is, data processing other than that for the substrate being exposed can be stored in the memory by performing measurement using a data measurement device (which is a device different from the exposure apparatus 1) for overlapping before the exposure process and by matching and managing the measurement data with the substrate. At this time, the data measurement device and the exposure apparatus can be set to almost the same environment (such as a holder and a substrate temperature) changes so that the magnification that cannot be corrected on the substrate stage 4 side can be measured without almost any change.

A difference due to suctioning of the substrate and the like caused by measurement with the data measurement device and the exposure apparatus can be obtained from results of the final overlapping exposure and can be input to the data correction as a process offset.

Further, the example in which the alignment system 5 is provided at a position apart from the projection module 7B in the first direction X1, that is, off-axis alignment in which the optical axis and the alignment axis of the projection module 7B are misaligned has been described. The present invention is not limited thereto, and on-axis alignment in which the optical axis and the alignment axis of the projection module 7B overlap, and alignment with a configuration of Through the lens (TTL) in which measurement is performed via the projection module 7B may be provided together.

The optical modulator (the spatial light modulation element 57) includes a liquid crystal element, a digital mirror device (a digital micro-mirror device (DMD)), a magneto optic spatial optical modulator (MOSLM), and the like. The optical modulator may be of a reflective type that reflects illumination light from the illumination module 7A which is an illumination optical system, a transmissive type that transmits the illumination light, or a diffraction type that diffracts the illumination light. The optical modulator can spatially and temporally modulate the illumination light.

The embodiments of the present invention have been described above, and the corresponding relationship between the present invention and the above-described embodiments will be additionally described here.

(1) In the above embodiment, an exposure apparatus that scans and exposes a substrate 20 via an optical modulator (a spatial light modulation element 75) in which a plurality of elements are controlled according to an image pattern includes a first substrate stage 4A that supports a first substrate 10, a second substrate stage 4B that supports a second substrate 10 different from the first substrate 10, a measurement part that measures information about the second substrate 10, and a generation part that generates control data, which controls the plurality of elements during scanning and exposing the second substrate 10, based on the information during an exposure process of the first substrate 10.

In the exposure apparatus having such a configuration, work efficiency in exposure can be improved by providing the plurality of substrate stages 4A and 4B. That is, while the first substrate 10 located on one of the substrate stages 4A and 4B (for example, the first substrate stage 4A) is being exposed, the exposure of the second substrate 10 can be started immediately after the exposure of the first substrate 10 is completed by performing all operations of unloading the exposed substrate 10 and loading the second substrate 10, and an alignment operation by the measurement part/ generation of correction data/transmission of data by the generation part on the other stage (for example, the second substrate stage 4B). In this way, the time required from the completion of exposure of the first substrate to the start of exposure of the next substrate 10 in a case the exposure apparatus has only one substrate stage 4, can be reduced. Thus, in this embodiment, it is possible to eliminate the waiting time for exposure that occurs in the conventional exposure apparatus 1 having only one substrate stage 4.

(2) Further, in the above embodiment, the measurement part measures information about the second substrate 10 during the exposure process of the first substrate 10.

With such a configuration, during the exposure process of the first substrate 10 performed on the first substrate stage 4A dedicated to the exposure which is one of the plurality of substrate stage 4A and 4B, the information about the substrate 10 can be measured by the second substrate stage 4B dedicated to the alignment (the measurement) and the data correction on the other side, it is possible to suppress occurrence of cycle delay.

(3) Further, in the above embodiment, the measurement part is provided apart from an exposure unit 20 (the optical modulator (the spatial light modulation element 75)) so that the first substrate stage 4A, which supports the first substrate 10 exposed by the exposure unit 20 including an optical modulator (the spatial light modulation element 75), and the second substrate stage 4B, which supports the second substrate 10 measured by the measurement part, do not collide with each other.

With such a configuration, since a movable range of the first substrate stage 4A and a movable range of the second substrate stage 4B are disposed so as not to overlap, the information about the substrate 10 can be measured by the measurement part of the other substrate stage 4 during the exposure operation by one substrate stage 4. Since both operations can be performed in parallel, it is possible to suppress the occurrence of cycle delay and to eliminate the waiting time for exposure.

(4) Further, in the above embodiment, the measurement part is installed on the second substrate stage 4B.

With such a configuration, during the exposure operation by the first substrate stage 4A, the information about the second substrate 10 can be measured by the measurement part on the second substrate stage 4B. After the exposure on the first substrate stage 4A is completed, the second substrate 10 measured by the second substrate stage 4B can be transported and placed on the first substrate stage 4A, and the second substrate 10 on the first substrate stage 4A can be exposed based on the measured information. That is, the second substrate 10 can be exposed with the minimum waiting time immediately after the exposure of the first substrate 10. Since both operations can be performed in parallel in this way, it is possible to suppress the occurrence of cycle delay and to eliminate the waiting time for exposure.

(5) Further, in the above embodiment, the first substrate stage 4A includes an acquisition part that acquires information regarding light of an exposure unit 20 including the optical modulator (the spatial light modulation element 75) during or before the exposure process of the first substrate 10, and the generation part generates control data based on the information measured by measurement part and the information acquired by the acquisition part.

With such a configuration, the information regarding light is acquired by the acquisition part during or before exposure process of the first substrate 10 on the first substrate stage 4A, and the generation part can generate the control data based on the information acquired by the acquisition part. Therefore, the second substrate 10 on the first substrate stage 4A can be exposed based on the control data generated by the generation part.

(6) Further, in the above embodiment, an exposure apparatus that scans and exposes a substrate 10 with an exposure unit 20 including an optical modulator in which a plurality of elements are controlled according to an image pattern includes a first substrate stage 4A that supports a first substrate 10, a second substrate stage 4B that supports a second substrate 10 different from the first substrate 10, and a generation part that generates control data of an exposure pattern for controlling and exposing a plurality of elements during scanning and exposing of the second substrate 10, wherein the first substrate stage 4A includes an acquisition part that acquires information regarding light of the exposure unit 20, and wherein the generation part generates the control data based on the information acquired by the acquisition part.

With such a configuration, the work efficiency in exposure can be improved by providing a plurality of substrate stages 4A and 4B. That is, the acquisition part can acquire the information regarding the light from the exposure unit 20 on the second substrate stage 4B, and the generation part can generate control data of the exposure pattern based on the information acquired by the acquisition part. Therefore, the second substrate 10 on the first substrate stage 4A can be exposed based on the exposure pattern generated by the generation part.

(7) Further, in the above embodiment, the generation part generates the control data during an exposure process of the first substrate 10.

With such a configuration, during the exposure process of the first substrate 10 performed on the first substrate stage 4A dedicated to exposure which is one of the plurality of substrate stages 4A and 4B, since the generation part can generate the control data of the exposure pattern based on the information regarding the light of the second substrate 10 exposed next to the first substrate 10, it is possible to suppress the occurrence of cycle delay.

(8) Further, in the above embodiment, the acquisition part obtains information regarding light during or before an exposure process of the first substrate 10.

With such a configuration, during or before the exposure process for the first substrate 10 on the first substrate stage 4A, the acquisition part can acquire the information regarding the light of the exposure unit 20 on the second substrate stage 4B, and the generation part can generate the control data of the exposure pattern based on the information acquired by the acquisition part.

(9) Further, in the above embodiment, the acquisition part acquires at least one of information regarding an illuminance of light and information regarding the first substrate stage 4A.

With such a configuration, since the control data of the exposure pattern can be generated by the generation part based on the information acquired by the acquisition part, exposure can be performed with higher accuracy.

(10) Further, in the above embodiment, the generation part includes a memory that stores the control data during the exposure process of the first substrate 10.

With such a configuration, since the control data generated by the generation part can be stored in the memory, the control data stored in the memory can be efficiently transmitted to the exposure unit 20 during the exposure of the first substrate 10 or at an appropriate timing before the start of exposure of the second substrate 10.

(11) Further, in the above embodiment, a transmission part that transmits the control data from the memory to an exposure unit 20 including the optical modulator is further included, and the transmission part transmits the control data to the exposure unit 20 before the exposure unit 20 starts exposure on the second substrate 10.

With such a configuration, the control data generated by the generation part and stored in the memory can be efficiently transmitted to the exposure unit 20 before the exposure of the second substrate 10 is started.

(12) Further, in the above embodiment, a drive part that moves the second substrate stage 4B is further included, and in the scanning and exposing of the second substrate 10, the drive part moves the second substrate stage 4B, which supports the second substrate 10, with respect to the exposure unit 20 that has received the control data.

With such a configuration, instead of the first substrate stage 4A, the second substrate stage 4B can be driven by the drive part and can be moved to a position at which the exposure unit 20 can perform the exposure. That is, the exposure unit 20 can expose the second substrate 10 on the second substrate stage 4B. In this way, exposure can be performed by alternately switching between the first substrate stage 4A and the second substrate stage 4B at the position at which the exposure unit 20 can perform the exposure.

(13) Further, in the above embodiment, a transport part that unloads the first substrate 10 from the first substrate stage 4A and that loads a third substrate 10 onto the first substrate stage 4A from which the first substrate 10 has been unloaded, and a measurement device that measures information regarding the third substrate 10 on the first substrate stage 4A are further included, and the generation part generates control data of an exposure pattern for exposing the third substrate 10, based on the information.

With such a configuration, the transport part can unload the first substrate 10 on the first substrate stage 4A and can load the third substrate 10 onto the first substrate stage 4A, information regarding the third substrate 10 on the first substrate stage 4A can be measured by the measurement device, and the control data of the exposure pattern can be generated based on the measured information in the generation part.

(14) Further, in the above embodiment, the measurement device is provided apart from the exposure unit 20 so that the second substrate stage 4B, which supports the second substrate 10 exposed by the exposure unit 20, and the first substrate stage 4A, that supports the third substrate 10 measured by the measurement device, do not collide with each other.

With such a configuration, during the operation of exposing the third substrate on the second substrate stage 4B, the information about the third substrate 10 can be measured by the measurement device on the first substrate stage 4A. Since both operations can be performed in parallel in this way, it is possible to suppress the occurrence of cycle delay and to eliminate the waiting time for exposure.

(15) Further, in the above embodiment, the measurement device is installed on the first substrate stage 4A.

With such a configuration, information about the substrate 10 supported by both the first substrate stage 4A and the second substrate stage 4B can be measured by the measurement devices provided on the respective substrate stages 4A and 4B. Therefore, during the operation of exposing the substrate 10 on one substrate stage 4, the information about the substrate 10 can be measured by the measurement device on the other substrate stage 4. Since both operations can be performed in parallel in this way, it is possible to curb the occurrence of cycle delay and to eliminate the waiting time for exposure.

(16) Further, in the above embodiment, the memory includes a first memory, which records the information about a substrate 10 which is supported by the second substrate stage 4B measured by the measurement device, and a second memory, which records information about a substrate 10 which is supported by the first substrate stage 4A measured by the measurement device.

With such a configuration, since the control data generated by the generation parts of the first substrate stage 4A and the second substrate stage 4B can be stored in the first memory and the second memory corresponding to the substrate stages 4A and 4B, respectively, the control data stored in the memory can be efficiently transmitted to the exposure unit 20 during exposure of the substrate 10 or at appropriate timing before the start of exposure of the substrate 10.

(17) Further, in the above embodiment, a transport part that transports the second substrate 10 from the second substrate stage 4B to the first substrate stage 4A, and a driving device that moves the first substrate stage 4A are further included, and after the control data is generated by the generation part, the transport part loads the second substrate 10 onto the first substrate stage 4A from which the first substrate 10 has been unloaded, and the driving device moves the first substrate stage 4A, which is supporting the loaded second substrate 10, with respect to the exposure unit 20.

With such a configuration, the first substrate stage 4A can be driven by the driving device and can be moved to a position at which the exposure unit 20 can perform the exposure. That is, the second substrate 10 on the second substrate stage 4B can be transported onto the first substrate stage 4A by the transport part, and the exposure unit 20 can perform the exposure for the second substrate 10 on the first substrate stage 4A. In this way, the first substrate stage 4A can be disposed at the position at which the exposure unit 20 can perform the exposure, and the exposure can be performed.

(18) Further, in the above embodiment, the transport part loads the third substrate 10 onto the second substrate stage 4B from which the second substrate 10 has been unloaded, a measurement part that measures information about the third substrate 10 placed on the second substrate stage 4B is provided, and the generation part generates the control data regarding the third substrate 10 during the exposure process of the second substrate 10.

With such a configuration, during the exposure process of the second substrate 10 on the first substrate stage 4A, the information about the third substrate 10 loaded onto the second substrate stage 4B can be measured by the measurement part, and the control data can be generated by the generation part based on the information about the third substrate 10 measured by the measurement part. Since both operations can be performed in parallel in this way, it is possible to curb the occurrence of cycle delay and to eliminate the waiting time for exposure.

(19) Further, in the above embodiment, the generation part corrects preset exposure data and generates the control data.

With such a configuration, in the generation part, since correction can be performed by comparing the set exposure data and the measurement information based on the exposure data set in advance based on the information measured by the measurement part, correction with higher accuracy can be performed.

(20) Further, in the above embodiment, a plurality of exposure units 20 are provided, and a light source 61 and light from the light source 61 are dividedly exposed using a plurality of spatial light modulation elements 75.

With such a configuration, using the plurality of exposure units 20, the light source 61 and the light from the light source 61 can be dividedly exposed by the plurality of spatial light modulation elements 75.

(21) Further, in the above embodiment, an exposure apparatus that scans and exposes a substrate 10 via an optical modulator in which a plurality of elements are controlled according to an image pattern includes a substrate stage 4 that supports a first substrate 10, a receiving part that receives information about a second substrate 10, the information being measured by an apparatus different from the exposure apparatus, the second substrate being scanned and exposed by the exposure apparatus 1 after scanning and exposing the first substrate 10, a generation part that generates control data for controlling the plurality of elements during the scanning and exposing the second substrate 10, based on the information received by the receiving part, and a memory that stores the control data during an exposure process of the first substrate 10.

(22) Further, in the above embodiment, a projection part that projects an image of the image pattern onto the first substrate or the second substrate, and a position changing part that changes a position on the first substrate or the second substrate, during scanning and exposing the first substrate or the second substrate, wherein the image is projected by on the position the projection part, are further included. The position changing part controls at least one of a substrate stage 4, a substrate stage 4 holding the optical modulator 75, and a part of a projection system so as to change the position.

(23) Further, in the above embodiment, a transport part that unloads the first substrate 10 from the substrate stage 4 and that loads the second substrate 10, and a measurement part that measures information about the second substrate transported onto the substrate stage 4 are further included. The measurement part measures a mark, which is measured in order to measure information about the second substrate 10 by the different apparatus, and acquires the information about the second substrate 10.

(24) Further, in the above embodiment, a controller that associates identification information for identifying the substrate 10 with information about the second substrate 10 measured by the different apparatus or with the control data can be included.

(25) Further, in the above embodiment, exposing the substrate 10 using the exposure apparatus 1 according to any one of the above mentioned (1) to (20), and developing the exposed substrate 10 are included.

With such a configuration, devices can be manufactured efficiently by exposing the substrate 10 using the exposure apparatus 1 without waiting time for exposure and developing the exposed substrate 10.

(26) Further, in the above embodiment, exposing a flat panel display substrate using the exposure apparatus according to any one of the above mentioned (1) to (20), and developing the exposed substrate are included.

With such a configuration, a flat panel display can be efficiently manufactured by exposing the substrate 10 using the exposure apparatus 1 without waiting time for exposure and developing the exposed substrate 10.

(27) Further, in the above embodiment, an exposure method which scans and exposes a substrate with an exposure unit having an optical modulator includes supporting a first substrate on a first stage, supporting a second substrate different from the first substrate on a second stage, measuring information about the second substrate, and generating control data of an exposure pattern for exposing the second substrate based on the information during an exposure process of the first substrate.

With such a configuration, work efficiency in exposure can be improved by providing a plurality of substrate stages 4A and 4B. That is, while the first substrate 10 on one of the substrate stages 4A and 4B (for example, the first substrate stage 4A) is being exposed, the exposure of the second substrate 10 can be started immediately after the exposure of the first substrate 10 is completed by performing all operations of unloading the exposed substrate 10 and loading the second substrate 10, and an alignment operation by the measurement part/generation of correction data/transmission of data by the generation part on the other stage (for example, the second substrate stage 4B). Thus, the time required from the completion of exposure of the first substrate to the start of exposure of the next substrate 10 in a case the exposure apparatus has only one substrate stage 4 can be reduced. Thus, in this embodiment, it is possible to eliminate the waiting time for exposure that occurs in the conventional exposure apparatus 1 having only one substrate stage 4.

(28) Further, in the above embodiment, an exposure apparatus 1 that scans and exposes a substrate 10 by an exposure unit 20 having an optical modulator includes supporting a first substrate 10 on a first substrate stage 4A including an acquisition part for acquiring information regarding light of the exposure unit 20, supporting a second substrate 10, which is different from the first substrate 10, on the second substrate stage 4B, and generating control data of an exposure pattern for exposing the second substrate 10, based on the information acquired by the acquisition part.

With such a configuration, work efficiency in exposure can be improved by providing the plurality of substrate stages 4A and 4B. That is, the acquisition part can acquire the information regarding the light from the exposure unit 20 on the second substrate stage 4B, and the generation part can generate the control data of the exposure pattern based on the information acquired by the acquisition part. Therefore, the second substrate 10 on the first substrate stage 4A can be exposed based on the exposure pattern generated by the generation part.

(29) Further, in the above embodiment, an exposure method for scanning and exposing a substrate via an optical modulator in which a plurality of elements are controlled according to an image pattern includes supporting a first substrate on a stage, causing a receiving part to receive information about a second substrate which is measured by an apparatus different from an exposure apparatus that scans and exposes the substrate, the second substrate being scanned and exposed by the exposure apparatus after scanning and exposure with respect to the first substrate has been performed, generating control data for controlling the plurality of elements during scanning and exposure of the second substrate, based on the information received by the receiving part, and storing the control data in a memory during the exposure process of the first substrate.

(30) Further, in the above embodiment, exposing the substrate 10 by the exposure method according to any one of (27) to (29) and developing the exposed substrate 10 are included.

With such a configuration, it is possible to efficiently manufacture devices by exposing the substrate 10 without waiting time for exposure and developing the exposed substrate 10.

(31) Further, in the above embodiment, exposing a flat panel display substrate by the exposure method according to any one of (27) to (29), and developing the exposed substrate are included.

With such a configuration, a flat panel display can be efficiently manufactured by exposing the substrate 10 using the exposure apparatus 1 without waiting time for exposure and developing the exposed substrate 10.

Although the embodiment of the present invention has been described in detail with reference to the drawings, the specific configuration is not limited to the one described above, and various design changes can be made without departing from the scope of the present invention.

What is claimed is:

1. An exposure apparatus comprising:
   a first stage that supports a first substrate;
   a second stage that supports a second substrate different from the first substrate;
   a projection module;
   a spatial light modulator including a plurality of elements individually controlled based on image data so as to form an exposure pattern, light from an ON state element of the plurality of elements entering the first substrate or the second substrate through the projection module and light from an OFF state element of the plurality of elements entering other than the projection module;
   a measurement part that measures information about the second substrate; and
   a generation part that generates, during an exposure process of the first substrate, control data based on the information, the control data controlling the plurality of elements during a period in which the second substrate is exposed by the exposure apparatus.

2. The exposure apparatus according to claim 1, wherein the measurement part measures the information about the second substrate during the exposure process of the first substrate.

3. The exposure apparatus according to claim 1, wherein the measurement part is provided apart from the spatial light modulator so that the first stage, which supports the first substrate exposed by an exposure unit including the spatial light modulator, and the second stage, which supports the second substrate measured by the measurement part, do not collide with each other.

4. The exposure apparatus according to claim 1, wherein the measurement part is installed on the second stage.

5. The exposure apparatus according to claim 1, wherein the first stage includes an acquisition part which acquires information regarding light of an exposure unit including the spatial light modulator during or before the exposure process of the first substrate, and the generation part generates the control data based on the information measured by the measurement part and the information acquired by the acquisition part.

6. An exposure apparatus comprising:
   a first stage that supports a first substrate;
   a second stage that supports a second substrate different from the first substrate;

an exposure unit that includes a projection module and a spatial light modulator including a plurality of elements individually controlled based on image data so as to form an exposure pattern, light from an ON state element of the plurality of elements entering the first substrate or the second substrate through the projection module and light from an OFF state element of the plurality of elements entering other than the projection module; and a generation part that generates control data which controls the plurality of elements during a period in which the second substrate is exposed by the exposure apparatus, wherein the first stage includes an acquisition part that acquires information regarding light of the exposure unit, and wherein the generation part generates the control data based on the information acquired by the acquisition part.

7. The exposure apparatus according to claim 6, wherein the generation part generates the control data during an exposure process of the first substrate.

8. The exposure apparatus according to claim 6, wherein the acquisition part obtains information regarding the light during or before an exposure process of the first substrate.

9. The exposure apparatus according to claim 5, wherein the acquisition part acquires at least one of information regarding an illuminance of the light and information regarding the first stage.

10. The exposure apparatus according to claim 1, wherein the generation part includes a memory that stores the control data during the exposure process of the first substrate.

11. The exposure apparatus according to claim 10, further comprising a transmission part that transmits the control data from the memory to an exposure unit including the spatial light modulator, wherein the transmission part transmits the control data to the exposure unit before the exposure unit starts exposure on the second substrate.

12. The exposure apparatus according to claim 10, further comprising a drive part that moves the second stage, wherein, in the scanning and exposing the second substrate, the drive part moves the second stage, which supports the second substrate, with respect to an exposure unit which includes the spatial light modulator and has received the control data.

13. The exposure apparatus according to claim 12, further comprising:

a transport part that unloads the first substrate from the first stage and that loads a third substrate onto the first stage from which the first substrate has been unloaded; and a measurement device that measures information regarding the third substrate on the first stage, wherein the generation part generates control data of an exposure pattern that exposes the third substrate, based on the information.

14. The exposure apparatus according to claim 13, wherein the measurement part is provided apart from the exposure unit so that the second stage, which supports the second substrate exposed by the exposure unit, and the first stage, which supports the third substrate measured by the measurement part, do not collide with each other.

15. The exposure apparatus according to claim 13, wherein the measurement device is installed on the first stage.

16. The exposure apparatus according to claim 13, wherein the memory includes a first memory, which records information about a substrate which is supported by the second stage measured by the measurement device, and a second memory, which records information about a substrate which is supported by the first stage measured by the measurement device.

17. The exposure apparatus according to claim 10, further comprising:

a transport part that transports the second substrate from the second stage to the first stage; and a driving device that moves the first stage, wherein, after the control data is generated by the generation part, the transport part loads the second substrate onto the first stage from which the first substrate has been unloaded, and the driving device moves the first stage, which is supporting the loaded second substrate, with respect to an exposure unit including the spatial light modulator.

18. The exposure apparatus according to claim 17, wherein the transport part loads a third substrate onto the second stage from which the second substrate has been unloaded, a measurement part that measures information about the third substrate placed on the second stage is provided, and the generation part generates the control data regarding the third substrate during an exposure process of the second substrate.

19. The exposure apparatus according to claim 1, wherein the generation part corrects preset exposure data and generates the control data.

20. The exposure apparatus according to claim 1, wherein a plurality of exposure units are provided, and a light source and light from the light source are dividedly exposed using a plurality of spatial light modulation elements.

21. An exposure apparatus comprising:

a stage that supports a first substrate;

a receiving part that receives information about a second substrate, the information being measured by an apparatus different from the exposure apparatus, the second substrate being scanned and exposed by the exposure apparatus after scanning and exposing the first substrate;

a projection module;

a spatial light modulator including a plurality of elements individually controlled based on image data so as to form an exposure pattern, light from an ON state element of the plurality of elements entering the first substrate or the second substrate through the projection module and light from an OFF state element of the plurality of elements entering other than the projection module;

a generation part that generates control data which controls the plurality of elements during the scanning and exposing the second substrate, based on the information; and a memory that stores the control data during an exposure process of the first substrate.

22. The exposure apparatus according to claim 21, wherein:

the projection module projects an image of an image pattern onto the first substrate or the second substrate;

the exposure apparatus further comprises a position changing part that changes a position on the first substrate or the second substrate during scanning and exposing the first substrate or the second substrate, the image being projected on the position by the projection module; and the position changing part controls at least one of the stage, a stage holding the spatial light modulator, and a part of the projection module so as to change the position.

23. The exposure apparatus according to claim 21, further comprising:

a transport part that unloads the first substrate from the stage and that loads the second substrate; and a measurement part that measures information about the second substrate transported onto the stage, wherein the measurement part measures a mark, which is measured in order to measure the information about the second substrate by the different apparatus, and acquires the information about the second substrate.

24. The exposure apparatus according to claim 21, further comprising a controller that associates identification information for identifying the substrate with information about the second substrate measured by the different apparatus or with the control data.

25. A method for manufacturing a device, comprising:

exposing the substrate using the exposure apparatus according to claim 1; and developing the exposed substrate.

26. A method for manufacturing a flat panel display, comprising:

exposing a flat panel display substrate using the exposure apparatus according to claim 1; and developing the exposed substrate.

27. An exposure method comprising:

supporting a first substrate on a first stage;

supporting a second substrate different from the first substrate on a second stage;

measuring information about the second substrate; and generating, during an exposure process of the first substrate, control data based on the information, the control data controlling a plurality of elements during a period in which the second substrate is exposed by light from the plurality of elements through a projection module, wherein light from an ON state element of the plurality of elements enters the first substrate or the second substrate through the projection module and light from an OFF state element of the plurality of elements enters other than the projection module.

28. An exposure method comprising:

supporting a first substrate on a first stage including an acquisition part that acquires information regarding light of an exposure unit that includes a projection module and a spatial light modulator including a plurality of elements individually controlled based on image data so as to form an exposure pattern, light from an ON state element of the plurality of elements entering the first substrate or the second substrate through the projection module and light from an OFF state element of the plurality of elements entering other than the projection module;

supporting a second substrate different from the first substrate, on a second stage; and generating control data of an exposure pattern that exposes the second substrate, based on the information.

29. An exposure method comprising:

supporting a first substrate on a stage;

causing a receiving part to receive information about a second substrate which is measured by an apparatus different from an exposure apparatus which scans and exposes the substrate, the second substrate being scanned and exposed by the exposure apparatus after scanning and exposure with respect to the first substrate has been performed;

generating, during an exposure process of the first substrate, control data based on the information, the control data controlling a plurality of elements during a period in which the second substrate is exposed by light from the plurality of elements through a projection module, light from an ON state element of the plurality of elements entering the first substrate or the second substrate through the projection module and light from an OFF state element of the plurality of elements entering other than the projection module; and storing the control data in a memory during the exposure process of the first substrate.

30. A method for manufacturing a device, comprising:

exposing the substrate using the exposure method according to claim 27; and developing the exposed substrate.

31. A method for manufacturing a flat panel display, comprising:

exposing a flat panel display substrate using the exposure method according to claim 27; and developing the exposed substrate.

* * * * *